US008192047B2

(12) United States Patent
Bailey et al.

(10) Patent No.: US 8,192,047 B2
(45) Date of Patent: Jun. 5, 2012

(54) HIGH COLOR RENDERING INDEX WHITE LED LIGHT SYSTEM USING MULTI-WAVELENGTH PUMP SOURCES AND MIXED PHOSPHORS

(75) Inventors: Edward Bailey, Westampton, NJ (US); Ellen S. Tormey, Princeton Junction, NJ (US)

(73) Assignee: Lighting Science Group Corporation, Satellite Beach, FL (US)

( * ) Notice: Subject to any disclaimer, the term of this patent is extended or adjusted under 35 U.S.C. 154(b) by 333 days.

(21) Appl. No.: 12/527,087

(22) PCT Filed: Feb. 15, 2008

(86) PCT No.: PCT/US2008/054073
§ 371 (c)(1),
(2), (4) Date: Aug. 13, 2009

(87) PCT Pub. No.: WO2008/101156
PCT Pub. Date: Aug. 21, 2008

(65) Prior Publication Data
US 2010/0118510 A1    May 13, 2010

Related U.S. Application Data

(60) Provisional application No. 60/890,160, filed on Feb. 15, 2007.

(51) Int. Cl.
*F21V 9/00* (2006.01)

(52) U.S. Cl. .............................. 362/231; 362/84; 257/98
(58) Field of Classification Search ................ 362/231, 362/84; 257/98
See application file for complete search history.

(56) References Cited

U.S. PATENT DOCUMENTS

| 6,234,648 | B1 * | 5/2001 | Borner et al. | 362/235 |
| 7,564,180 | B2 * | 7/2009 | Brandes | 313/501 |
| 2006/0072314 | A1 | 4/2006 | Rains | |
| 2006/0126326 | A1 | 6/2006 | Ng et al. | |
| 2007/0223219 | A1 * | 9/2007 | Medendorp et al. | 362/231 |
| 2008/0012928 | A1 * | 1/2008 | Sparer | 347/188 |

OTHER PUBLICATIONS

PCT International Preliminary Report on Patentability for International Application No. PCT/US2008/054073; International Filing Date: Feb. 15, 2008; Date of Mailing: Aug. 27, 2009.

* cited by examiner

*Primary Examiner* — Robert May
(74) *Attorney, Agent, or Firm* — Cantor Colburn LLP

(57) ABSTRACT

The present invention relates to an LED lighting system producing light having improved Color Rendering Index (CRI). The system includes a plurality of LEDs wherein the LEDs have at least a first and second characteristic wavelength, and a mixed phosphor layer overlying at least one of a portion of the plurality of LEDs, the phosphor layer absorbing at least a portion of the LED-emitted light and producing phosphor-emitted light, wherein the phosphors includes a third characteristic wavelength and a fourth characteristic wavelength, wherein the third characteristic wavelength and fourth characteristic wavelength are not the same.

28 Claims, 24 Drawing Sheets

Typical photometric properties and spectra for daylight white light engine with 4 blue die Total Luminous Flux & Color Parameter

| | |
|---|---|
| Total Luminous Flux: | 2.076e+002 lm |
| Radiant Flux: | 5.9135e−001 W |
| Dominant Wavelength: | 577.2 nm |
| Peak Wavelength: | 452.1 nm |
| Efficacy: | 40.36 lm/W |
| Current (mA): | 699.957 mA |
| Voltage (V): | 7.348 V |

Color Indices
| | |
|---|---|
| General CRI: | 64.30 |
| Color Temperature: | 4.528e+003 K |

1931 Coordinates (2°)
| | |
|---|---|
| x: | 0.3596 |
| y: | 0.3614 |

Typical photometric properties and spectra for daylight white light engine with 4 blue die Total Luminous Flux & Color Parameter

| | |
|---|---|
| Total Luminous Flux: | 1.261e+002 lm |
| Radiant Flux: | 3.9524e−001 W |
| Dominant Wavelength: | 582.8 nm |
| Peak Wavelength: | 594.7 nm |
| Efficacy: | 23.13 lm/W |
| | |
| Current (mA): | 699.963 mA |
| Voltage (V): | 7.787 V |

Color Indices
| | |
|---|---|
| General CRI: | 76.55 |
| Color Temperature: | 3.049e+003 K |

1931 Coordinates (2°)
| | |
|---|---|
| x: | 0.4328 |
| y: | 0.4014 |

Typical photometric properties and spectra for warm white light engine with 3 blue and 1 cyan die and 90/10 600/573nm phosphor mix.

Total Luminous Flux & Color Parameter

| | |
|---|---|
| Total Luminous Flux: | 1.166e+002 lm |
| Radiant Flux: | 3.7701e−001 W |
| Dominant Wavelength: | 582.6 nm |
| Peak Wavelength: | 595.9 nm |
| Efficacy: | 23.80 lm/W |
| Current (mA): | 699.961 mA |
| Voltage (V): | 7.001 V |

Color Indices
General CRI: 80.85
Color Temperature: 3.054e+003 K

1931 Coordinates (2°)
x: 0.4332
y: 0.4029

LED light source cavity with pump sources (4) emitting 445-460nm, or wide band 425-485nm. Die arrangement may include a larger number of smaller pump emitters in several placement configurations.

| | | | 2850 | K | | | |
|---|---|---|---|---|---|---|---|
| Robertson's Calculated CCT | | | | | | | |
| McCamy ESTIMATED CCT | | | 2851 | K | | | |
| | | | | | | | |
| 1931 2 DEG COLOR SPACE | | | | | | | |
| | x | y | Φ lumens | Φ_T rad watts | Φ multiplier | % light | |
| pump 452nm | 0.1504 | 0.0317 | 1.6 | 0.03987236 | 0.9 | 0.5% | |
| pump 458nm | 0.1438 | 0.0425 | 2.1 | 0.03989233 | 0.9 | 0.7% | |
| pump 493nm | 0.0720 | 0.3479 | 15.2 | 0.07670785 | 1.8 | 4.8% | |
| direct 634nm | 0.6953 | 0.3016 | 38.4 | 0.21269359 | 7.1 | 12.2% | |
| phosphor_524nm | 0.2821 | 0.6318 | 49.6 | 0.10126437 | 0.9 | 15.7% | |
| phosphor_573nm | 0.4753 | 0.5153 | 124.5 | 0.27172125 | 1.8 | 39.5% | |
| phosphor_600nm | 0.5541 | 0.4431 | 84.1 | 0.25784827 | 1.5 | 26.7% | |
| Composite SPD | 0.4460 | 0.4036 | 315.5 | 1 | | 100.0% | |
| | | | | | | | |
| CRI | R8= | 97.4 | | | | | |
| CRI | R14= | 96.8 | | | | | |

*FIG. 12A*

2850K high CRI solution, R8=97.4, R14=96.8, Light Efficacy=315.5 lumens/optical watt 2850K high CRI solution, R8=97.4, R14=96.8, Light Efficacy=315.5 lumens/optical watt 2850K high CRI solution, R8=97.4, R14=96.8, Light Efficacy=315.5 lumens/optical watt

| Robertson's Calculated CCT | | | 4750 | K | | |
|---|---|---|---|---|---|---|
| McCamy ESTIMATED CCT | | | 4753 | K | | |
| | | | | | | |
| 1931 2 DEG COLOR SPACE | | | | | | |
| | x | y | Φ lumens | Φ_T rad watts | Φ multiplier | % light |
| pump 452nm | 0.1504 | 0.0317 | 4.5 | 0.10958025 | 2.5 | 1.5% |
| pump 458nm | 0.1438 | 0.0425 | 3.9 | 0.074463854 | 1.7 | 1.3% |
| pump 493nm | 0.0720 | 0.3479 | 18.8 | 0.09450648 | 2.2 | 6.2% |
| direct 634nm | 0.6953 | 0.3016 | 18.5 | 0.10234095 | 3.4 | 6.1% |
| phosphor_524nm | 0.2821 | 0.6318 | 105.4 | 0.215536502 | 2.0 | 34.9% |
| phosphor_573nm | 0.4753 | 0.5153 | 66.8 | 0.14574142 | 1.0 | 22.1% |
| phosphor_600nm | 0.5541 | 0.4431 | 84.1 | 0.25782735 | 1.5 | 27.9% |
| Composite SPD | 0.3530 | 0.3616 | 301.9 | 1 | | 100.0% |
| | | | | | | |
| CRI | R8= | 96.4 | | | | |
| CRI | R14= | 95.5 | | | | |

4750K high CRI solution, R8=96.4, R14=95.5, Light Efficacy=301.9 lumens/watt

*FIG. 13A*

4750K high CRI solution, R8=96.4, R14=95.5, Light Efficacy=301.9 lumens/watt

| | | x | y | Φ lumens | $\Phi_T$ rad watts | Φ multiplier | % light |
|---|---|---|---|---|---|---|---|
| Robertson's Calculated CCT | | 5250 K | | | | | |
| McCamy ESTIMATED CCT | | 5250 K | | | | | |
| 1931 2 DEG COLOR SPACE | | | | | | | |
| pump 452nm | | 0.1504 | 0.0317 | 5.5 | 0.13390775 | 3.1 | 1.8% |
| pump 458nm | | 0.1438 | 0.0425 | 3.5 | 0.0667835 | 1.5 | 1.2% |
| pump 493nm | | 0.0720 | 0.3479 | 18.2 | 0.09186193 | 2.1 | 6.0% |
| direct 634nm | | 0.6953 | 0.3016 | 17.7 | 0.09795865 | 3.2 | 5.8% |
| phosphor_524nm | | 0.2821 | 0.6318 | 119.1 | 0.24344597 | 2.2 | 39.4% |
| phosphor_573nm | | 0.4753 | 0.5153 | 67.0 | 0.14632764 | 1.0 | 22.1% |
| phosphor_600nm | | 0.5541 | 0.4431 | 74.7 | 0.21971456 | 1.3 | 23.7% |
| Composite SPD | | 0.3389 | 0.3575 | 302.7 | 1 | | 100.0% |
| | R8= | 97.7 | | | | | |
| | R14= | 96.6 | | | | | |

*FIG. 14A*

5250K High CRI solution, R8=97.7, R14=96.6, Light Efficacy=302.7 lumens/watt

5250K High CRI solution, R8=97.7, R14=96.6, Light Efficacy=302.7 lumens/watt

5250K High CRI solution, R8=97.7, R14=96.6, Light Efficacy=302.7 lumens/watt

| Robertson's Calculated CCT | | | 6751 | K | | |
|---|---|---|---|---|---|---|
| McCamy ESTIMATED CCT | | | 6750 | K | | |
| 1931 2 DEG COLOR SPACE | | | | | | |
| | x | y | Φ lumens | Φ_T rad watts | Φ multiplier | % light |
| pump 450nm | 0.1523 | 0.0289 | 6.5 | 0.17316314 | 4.0 | 2.3% |
| pump 458nm | 0.1438 | 0.0425 | 4.7 | 0.08915706 | 2.1 | 1.6% |
| pump 493nm | 0.0720 | 0.3479 | 21.8 | 0.10992916 | 2.5 | 7.7% |
| direct 634nm | 0.6953 | 0.3016 | 12.1 | 0.06687012 | 2.2 | 4.2% |
| phosphor_524nm | 0.2821 | 0.6318 | 103.5 | 0.21159188 | 1.9 | 36.5% |
| phosphor_573nm | 0.4753 | 0.5153 | 73.9 | 0.16121638 | 1.1 | 26.0% |
| phosphor_600nm | 0.5541 | 0.4431 | 61.3 | 0.18807227 | 1.1 | 21.6% |
| Composite SPD | 0.3095 | 0.3213 | 283.8 | 1 | | 100.0% |
| CRI | R8= | 96.5 | | | | |
| CRI | R14= | 95.7 | | | | |

6750K High CRI solution, R8=96.5, R14=95.7, Light Efficacy=283.8 lumens/watt

*FIG. 15A*

6750K High CRI solution, R8=96.5, R14=95.7, Light Efficacy=283.8 lumens/watt

|    | PhosLyrThickness above die (mm) | chromaX | chromaY |
|----|---------|----------|----------|
| 1  | 0.42    | 0.443934 | 0.40418  |
| 2  | 0.434444| 0.454732 | 0.412726 |
| 3  | 0.448889| 0.459328 | 0.415275 |
| 4  | 0.463333| 0.464274 | 0.422093 |
| 5  | 0.477778| 0.46908  | 0.427351 |
| 6  | 0.492222| 0.476657 | 0.433087 |
| 7  | 0.506667| 0.477621 | 0.439243 |
| 8  | 0.521111| 0.483919 | 0.444053 |
| 9  | 0.535556| 0.487922 | 0.445585 |
| 10 | 0.55    | 0.491581 | 0.446907 |

3 blue die emitters (wavelength 452nm dominant) + 1 red emitter (623nm dominant) + 1 phosphor (573nm peak wavelength)

HIGH COLOR RENDERING INDEX WHITE LED LIGHT SYSTEM USING MULTI-WAVELENGTH PUMP SOURCES AND MIXED PHOSPHORS

RELATED APPLICATION

The present application claims priority to U.S. Provisional Patent Application No. 60/890,160, filed Feb. 15, 2007, the entire contents of which are hereby incorporated by reference in its entirety.

FIELD OF THE INVENTION

The present invention generally relates to LED lighting systems. More specifically, the present invention relates to LED lighting systems using multiple LED light sources overlaid with a phosphor layer.

BACKGROUND OF THE INVENTION

Light sources which produce a high color rendering index (CRI) have many applications in the lighting industry. CRI is an indication of the vibrance of the color of light being produced by a light source, and is an indication of the amount of color shift exhibited by the light source upon reflectance. The higher the CRI value for a particular light source, the more white the light and the better or more true that the light source renders the colors of various objects it is used to illuminate. One method for determining CRI is referred to as "R8" and involves the use of eight color chips or palettes which are illuminated by the light source. A CRI value is determined for each of the eight color chips being illuminated, with a CRI of 100 indicating perfect color rendering for that particular color chip as compared to an ideal planckian radiator or daylight emission spectrum. The eight CRI values are then averaged to produce a single CRI value for the light source being evaluated. Alternatively, other CRI evaluation techniques, such as the use of 14 color chips, may be used. High CRI light, or high color rendering light accents the various colors in objects which are to be illuminated.

Another factor to be considered in evaluating a light source is the concept of "color temperature," which is an indication of how much color is perceived to be produced by the light source. Higher color temperature values are used to refer to "cool" color temperatures, where the color of light produced is perceived to have a blue-ish tint. The peak wavelength of the spectral power distribution of the light is inversely proportional to the color temperature of the light. Lower color temperature values are used to refer to "warm" white light which is perceived as having a more yellow color.

Traditional solid state LED lights used to create white light sources have typically used blue LEDs having an excitation near 440-460 nm in conjunction with 573 nm yellow phosphors overlaid on the LEDs. It should be noted that the designation of the phosphor refers to the color (expressed in wavelengths) of the light emitted by the phosphor based on the light incident to the phosphor. Thus, "yellow" phosphor refers to phosphor which emits light in the yellow range, approximately 573 nm. The phosphor layer converts lower wavelength light, such as that generated by the LEDs, into higher wavelength light. This is commonly referred to as luminescence, or phosphor luminescence.

However, the resulting light tends to be a "cool" light, having a color temperature in the range of 4000-4700 Kelvin (K). Furthermore, the CRI of such lights tends to be relatively low, often in the range of CRI value of 60.

Thus, there is a need to produce "warm" white and "cool" white light using LED light sources, which also exhibits a relatively higher CRI value. There is also a need to generate the light efficiently, as measured by the Light Efficiency Ratio ("LER"), also referred to as the Light Efficacy, with higher efficiency being preferable.

SUMMARY OF THE INVENTION

The present invention is generally directed to a light source made up of multiple LEDS, where the LEDs do not all have the same characteristic wavelength. Also, the phosphor layer which is used may be made as a mixture of different types of phosphor, such that the phosphor layer exhibits two or more characteristic colors. In other words, the incident light into the phosphor layer causes the mixed phosphor layer to emit light of at least two different wavelengths. Such a mixed type of phosphor is commonly referred to as "A/B" phosphor where the designation "A/B" refers to the ratio or the mix of the phosphor and indicates that the light being output by the phosphor is A % light having a first wavelength and B % light having a second wavelength, where A+B=100%. Thus, the designation 90/10 of 600/524 nm phosphor refers to a phosphor which outputs 90% of its output light at 600 nm and 10% of its output light at 524 nm.

According to the present invention, the phosphor layer may be selectively overlaid on all of the LEDs, some of the LEDs, or on a selected portion of one or more of the LEDs. The phosphor layer may be provided as a separate structure, or layer, above the LEDs, or alternatively may be deposited directly on the surface of each LED die.

DESCRIPTION OF THE DRAWINGS

The above and still further objects, features and advantages of the present invention will become apparent upon consideration of the following detailed description of a specific embodiment thereof, especially when taken in conjunction with the accompanying drawings wherein like reference numerals in the various figures are utilized to designate like components, and wherein.

DETAILED DESCRIPTION OF THE INVENTION

Figure 1:
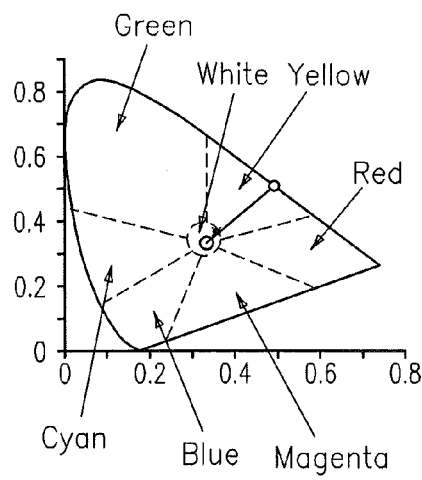
FIG. 1 is an illustration of the light characteristics and parameters of a prior art LED light source made up of four blue LEDs and a yellow phosphor (573 nm) overlaid on all four LEDs.
Figure 1:
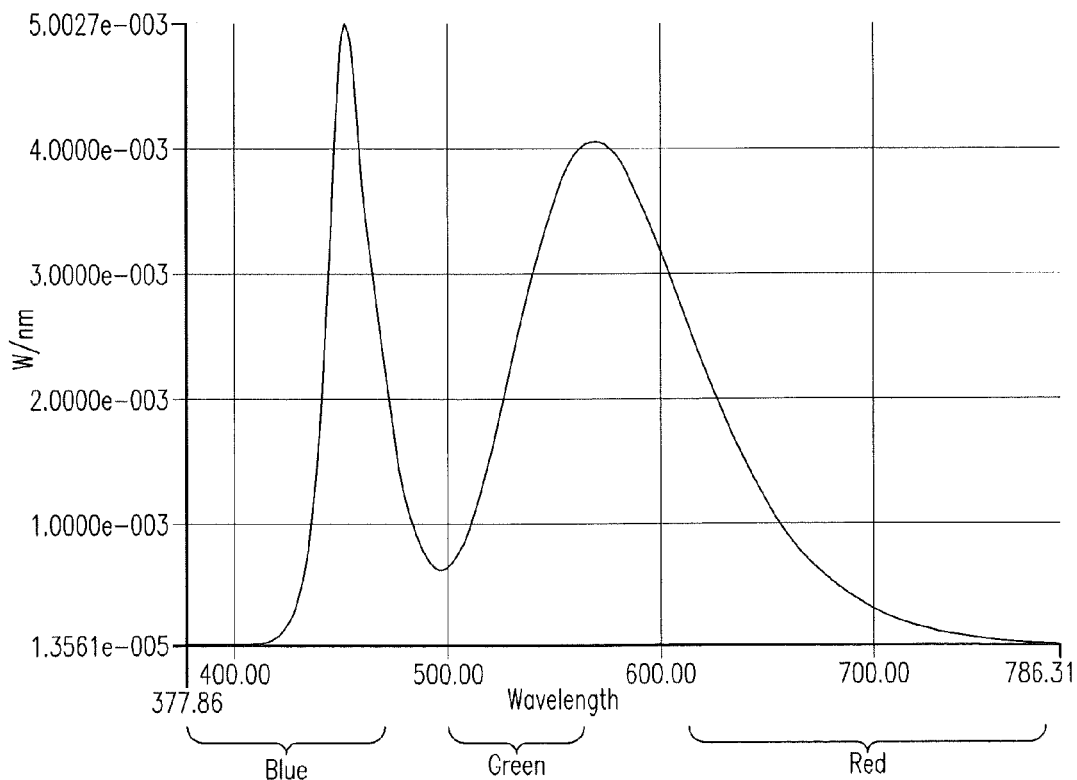

Referring now to FIG. 1, therein is illustrated the light characteristics and parameters of a prior art LED light source which utilizes four blue LEDs having a characteristic wavelength of 445-460 nm, along with a yellow phosphor layer (573 nm) overlaid on all four LEDs. This type of conventional light source exhibits a CRI of about 64.3 (as indicated in FIG. 1), which is relatively poor in terms of accurate color rendering. Also, the color temperature of such a light source is found to be rather cold (approximately 4528K). As shown in the spectral waveform at the bottom of FIG. 1, this LED light source does not have a sufficient red component in the output light. This is sometimes referred to as having a "hole" in the light spectrum. In addition, as illustrated, there is a minimal amount of light output in the spectrum range between the two wavelength peaks.

The parameters measured for this type of light source include Total Luminous Flux, which refers to the light emitted by the phosphor, as weighted by the human eye. As is understood, the human eye gives more/less importance to different parts of the light spectrum. Another parameter which is determined includes Radiant Flux, an indication of the light output by the phosphor without taking into account any weighting by the human eye. The parameter Dominant Wavelength refers to the wavelength which approximates the peak achromatic spectral distribution as compared to the monochromatic locus when tracing a directrix from the chromatic E point. The parameter Peak Wavelength refers to the highest power spectral component, regardless of any weighting.

Figure 2:
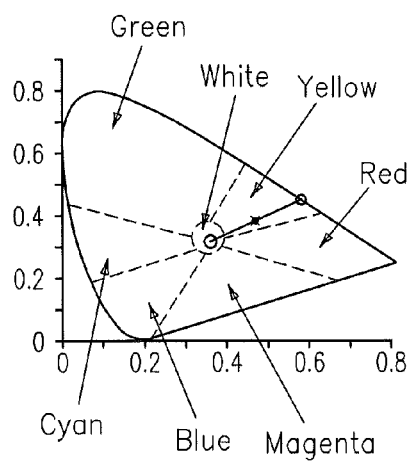
FIG. 2 is an illustration of the light characteristics and parameters of a prior art LED light source made up of four blue LEDs and an 82/18 orange/green phosphor (600/524 nm) overlaid on all four LEDs.
Figure 2:
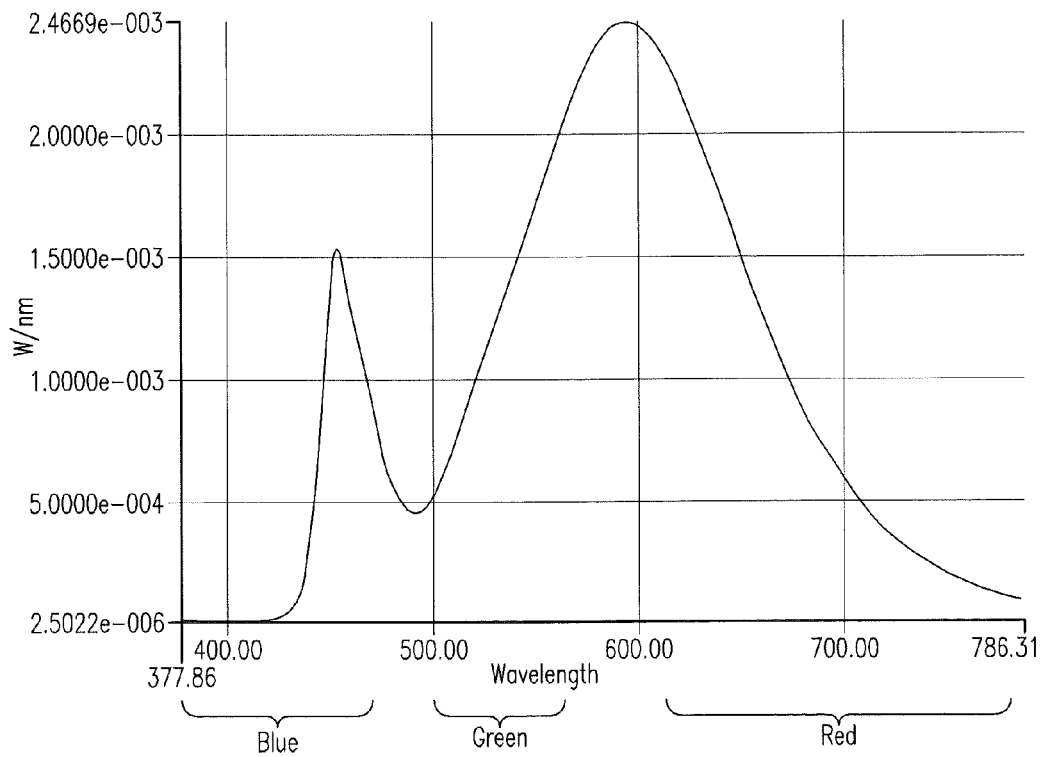

FIG. 2 illustrates the characteristics and parameters of another prior art LED light source which utilizes four blue LEDs (445-460 nm), along with a mixed orange/green phosphor (600/524 nm) with a ratio of 82/18. As shown in FIG. 2, the use of the mixed phosphor increases the CRI of this light source to about 76.55, as compared with 64.3 for the device of FIG. 1. Also, the color temperature of the device of FIG. 2 is 3049K, as compared to a color temperature of 4528K for the device of FIG. 1.

Figure 3:
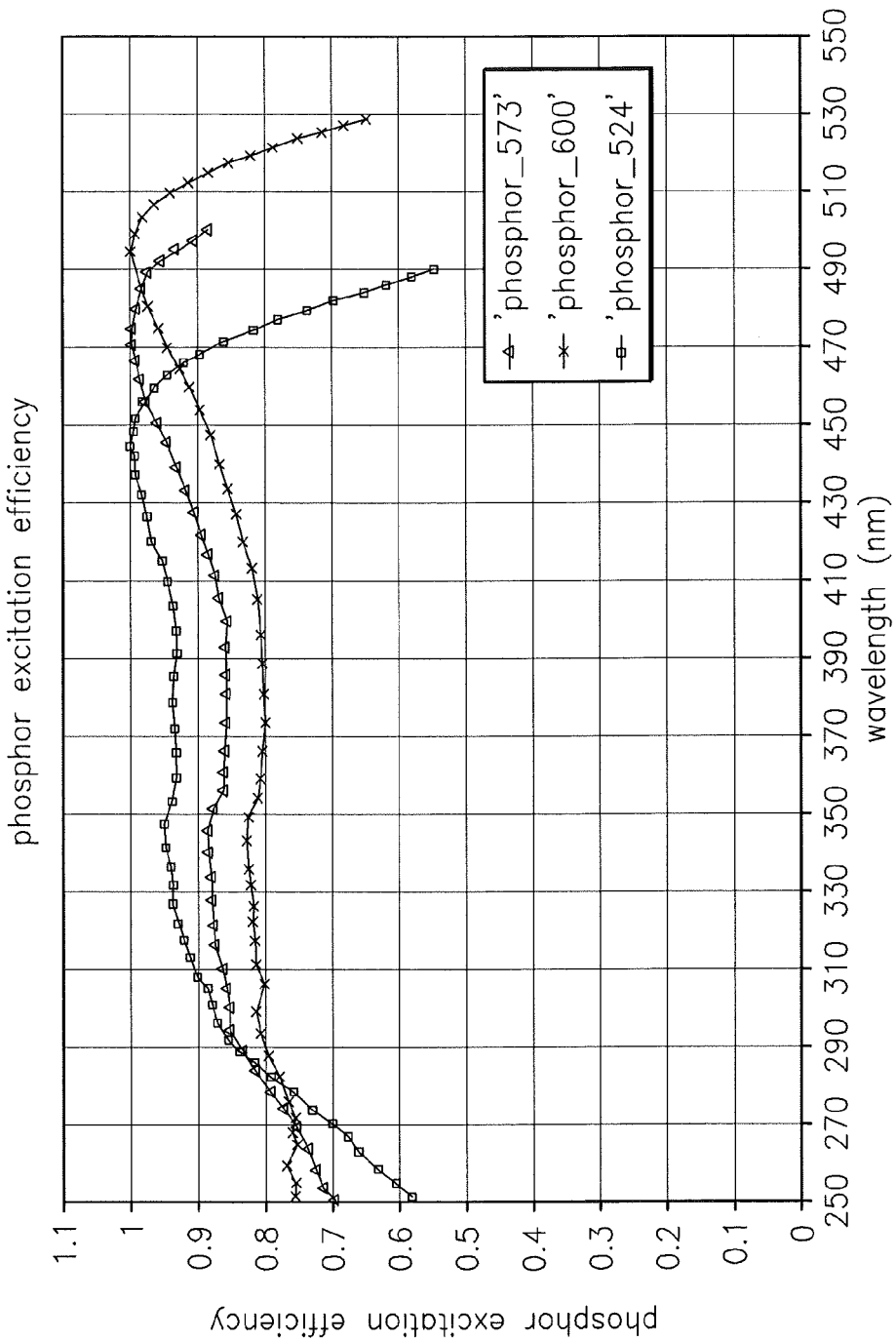
FIG. 3 is an illustration of the excitation efficiency for various types of phosphor layers.

Referring now to FIG. 3, therein is illustrated the excitation efficiency for various types of phosphors. The term "excitation efficiency" refers to the proportion of incident light at a first frequency which is converted to output light at a second frequency by the phosphor. Typically, not all of the incident light is converted to output light by the phosphor layer. Some of the incident light is lost due to heat. Also, some of the incident light passes through the phosphor layer (transparently) without any change in the frequency of the light. As shown in FIG. 3, the 524 nm phosphor exhibits a relatively high excitation efficiency but over a shorter range of wavelengths. The 573 nm phosphor exhibits a slightly lower excitation efficiency but over a slightly larger range of wavelengths. Finally, the 600 nm phosphor generally exhibits the lowest excitation efficiency, but maintains the excitation efficiency over a wider range of wavelengths.

Figure 4:
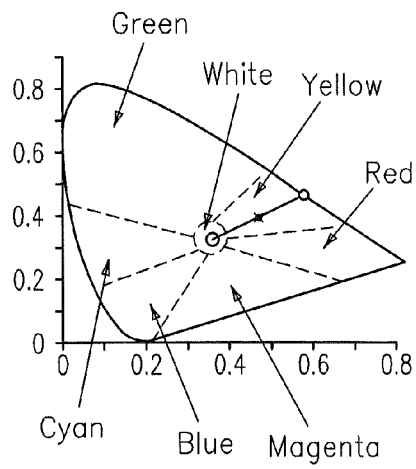
FIG. 4 is an illustration of the light characteristics and parameters of a first embodiment of an LED light source according to the present invention made up of three blue LEDs, one cyan LED and a 90/10 phosphor (600/573 nm) overlaid on all four LEDs.
Figure 4:
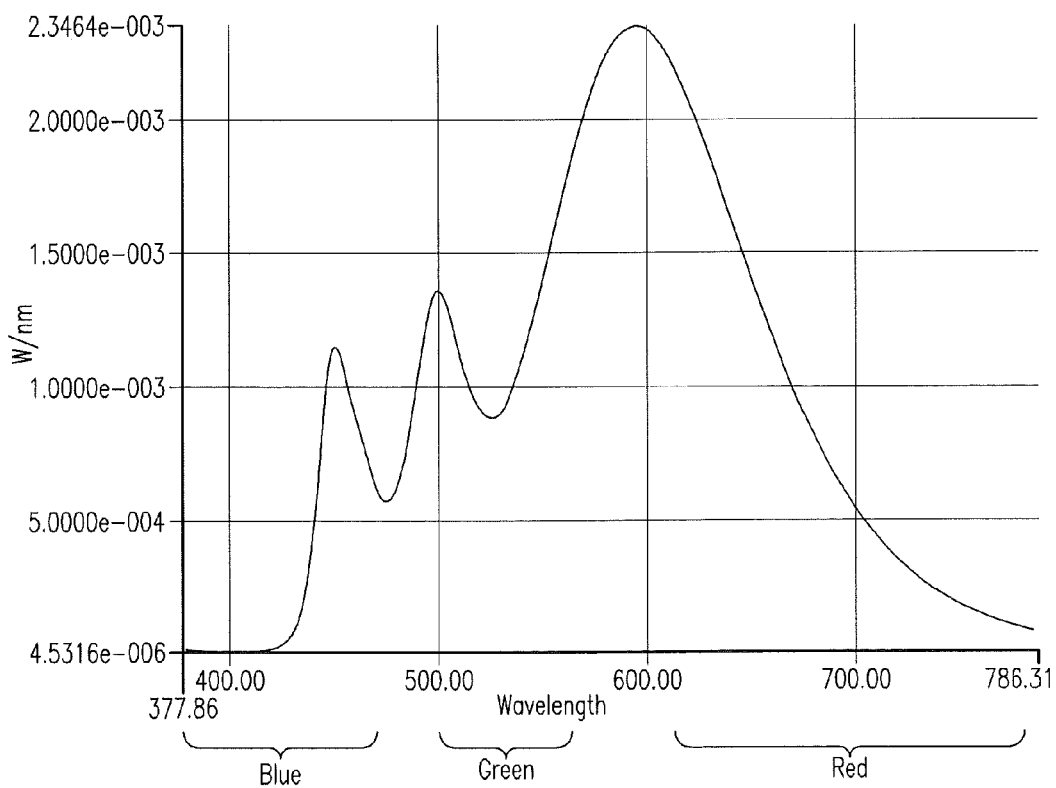

FIG. 4 illustrates the characteristics and parameters for a first embodiment of an LED light source according to the present invention. In the embodiment of FIG. 4, the LED light source includes three blue LEDs (445-460 nm) and one cyan LED (490-495 nm). The phosphor used is a mixed phosphor, 600/573 nm, with a ratio of 90/10. As shown in FIG. 4, the CRI for this embodiment is found to be 80.85, which is significantly higher than the prior art devices of FIGS. 1 and 2, which exhibit CRI values of 64.3 and 76.55, respectively. Although the CRI has improved noticeably, the light produced remains a pleasing warm white with a color temperature of 3054K.

Figure 5:
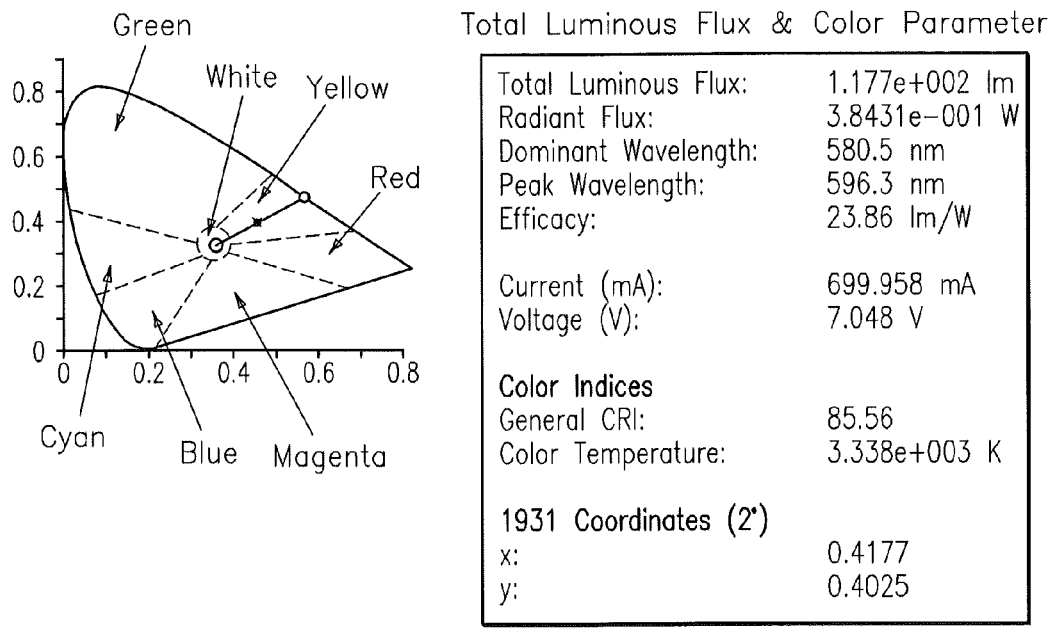
FIG. 5 is an illustration of the light characteristics and parameters of a second embodiment of an LED light source according to the present invention made up of three blue LEDs, one cyan LED and a mixed orange/green phosphor (600/524 nm) overlaid on all four LEDs.
Figure 5:
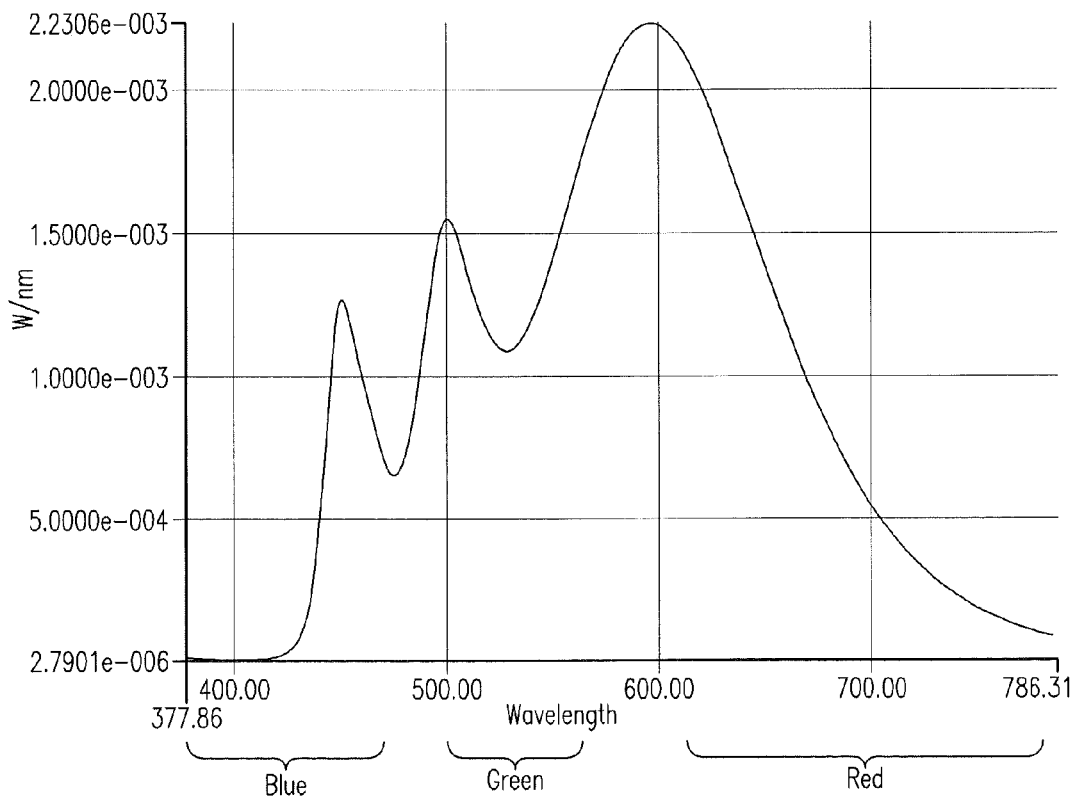

FIG. 5 illustrates the characteristics and parameters for a second embodiment of an LED light source according to the present invention. In the embodiment of FIG. 5, the LED light source includes three blue LEDs (445-460 nm) and one cyan LED (490-495 nm). The phosphor used is a mixed phosphor, 600/524 nm, with a ratio of 90/10. As shown in FIG. 5, the CRI for this embodiment is found to be 85.56, which is significantly higher than the prior art devices of FIGS. 1 and 2, which exhibit CRI values of 64.3 and 76.55, respectively. Although the CRI has improved noticeably, the color temperature has degraded somewhat, and is found to be 3338K.

Figure 6:
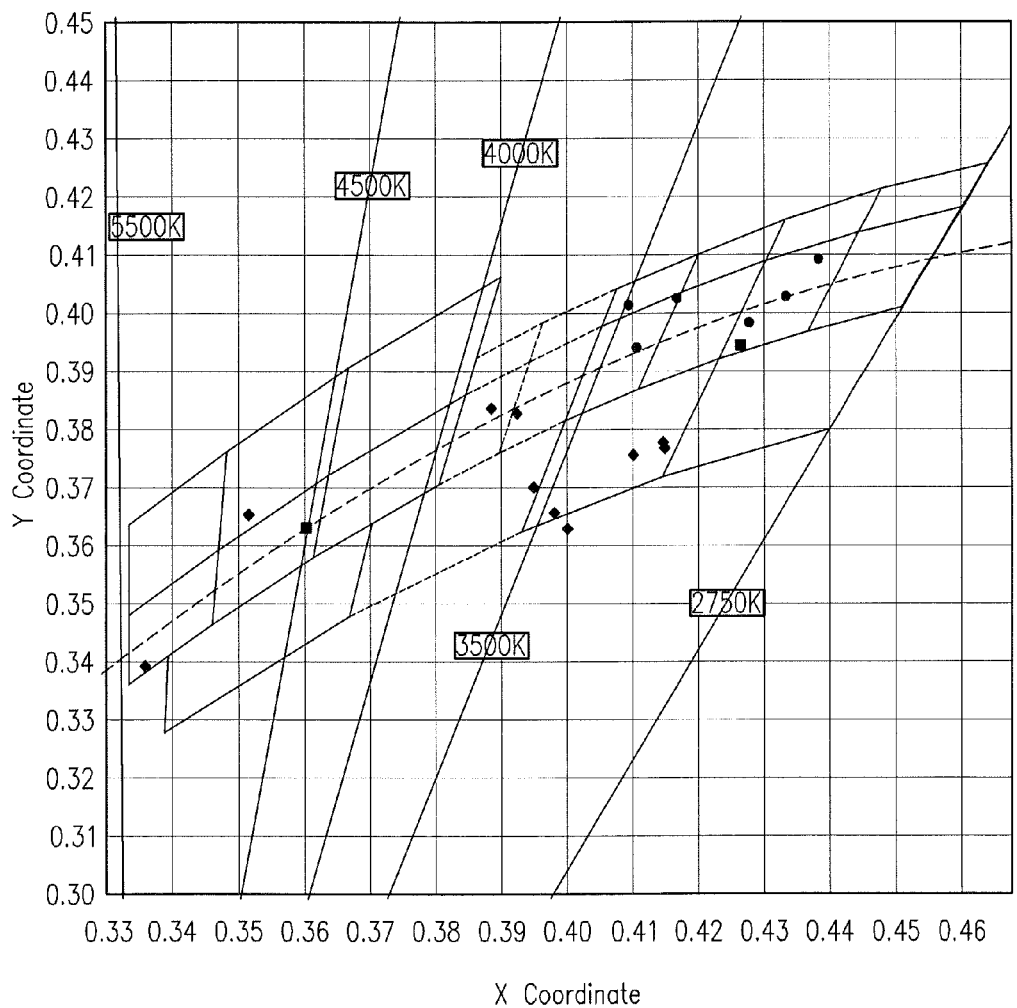
FIG. 6 is a CIE x,y coordinate plot illustrating the color characteristics of LED light sources according to the present invention.

FIG. 6 illustrates a CIE x,y coordinate plot showing the color characteristics of various embodiments of LED light sources according to the present invention. As shown in FIG. 6, the generally vertical, radiating lines are referred to as "isothermal lines" and represent constant color temperature characteristics. The areas in between the isothermal lines can be divided into relatively small regions, referred to as "color bins". The color temperature of the various devices can then be plotted and a determination made as to which "color bin" they each fall into.

Figure 7:
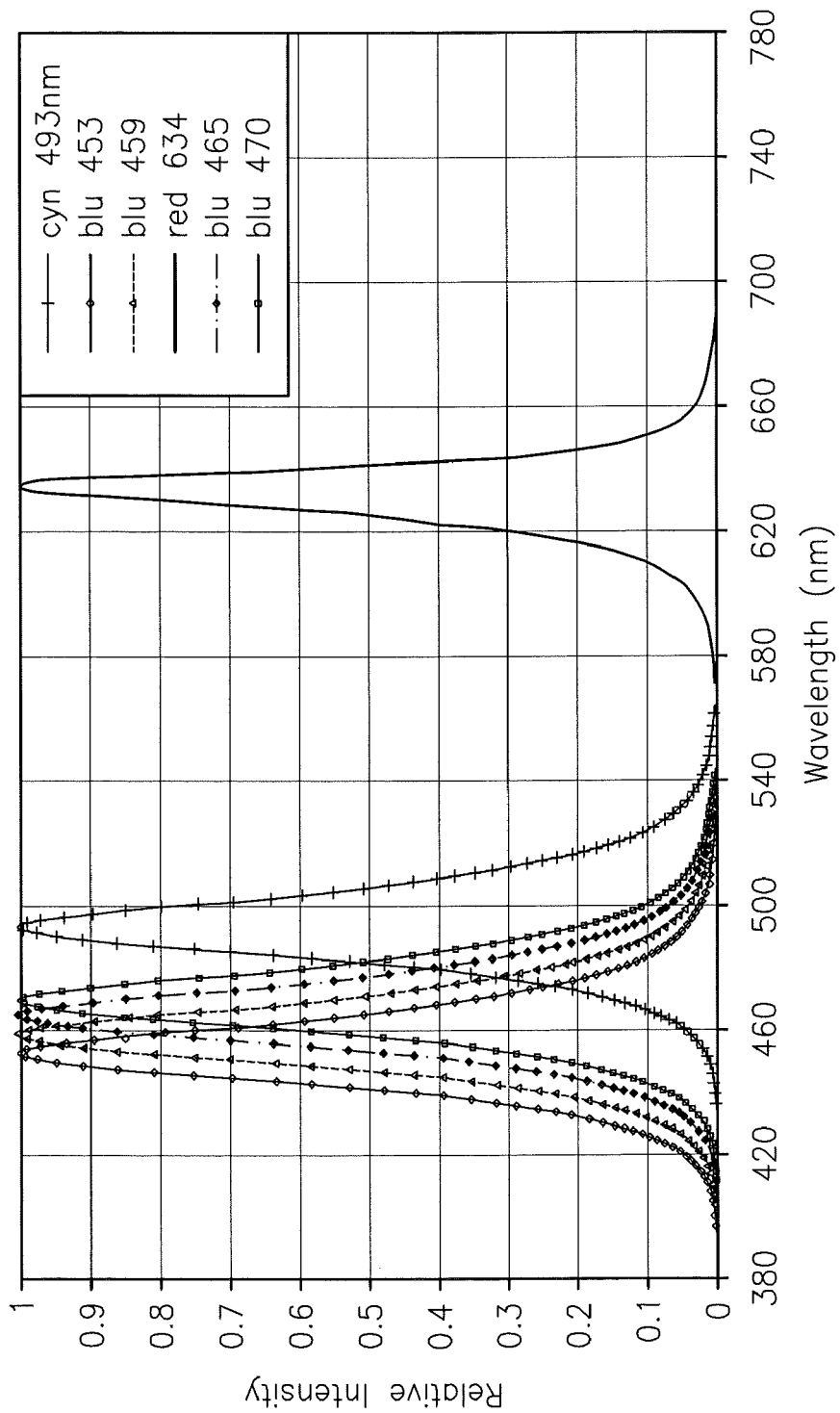
FIG. 7 is an illustration of the wavelength distribution characteristics of various LED dies used in the different embodiments of the present invention.

FIG. 7 is an illustration of the frequency characteristics of various LED dies used in the different embodiments of the present invention. As shown in FIG. 7, each LED die has a spectral characteristic exhibiting a single peak wavelength corresponding to the color of light generated by that particular LED die.

Figure 8:
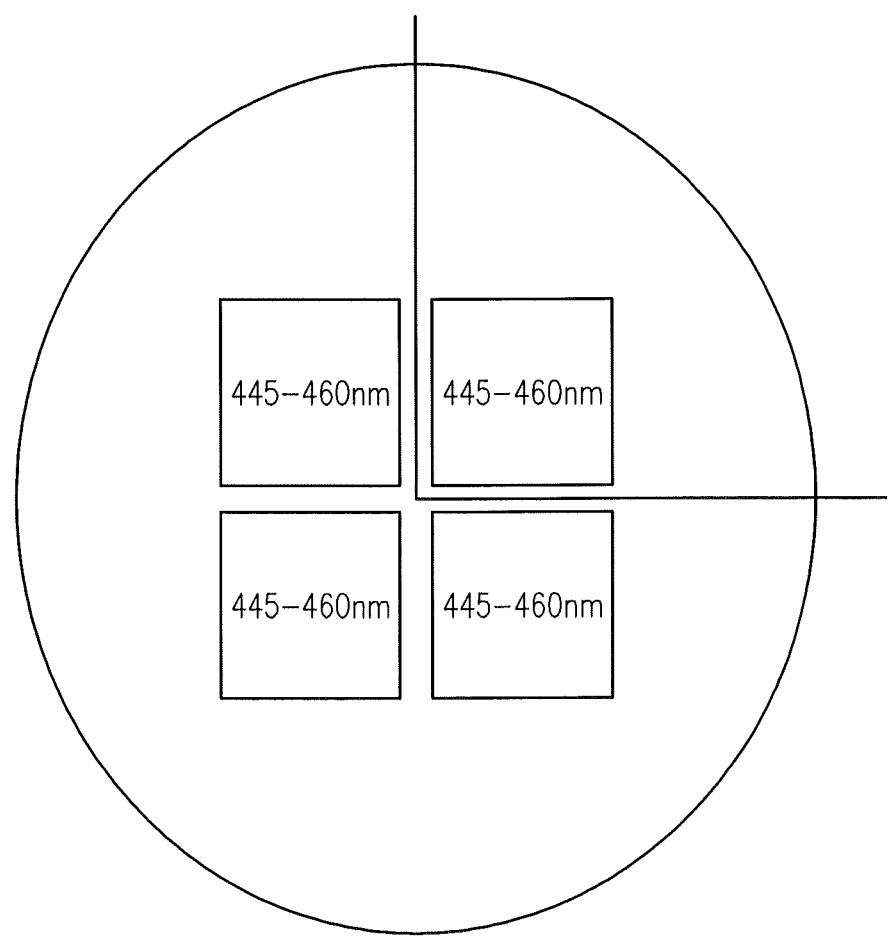
FIG. 8 is an illustration of the layout of a prior art four LED light source using four blue (445-460 nm) LEDs.
Figure 9:
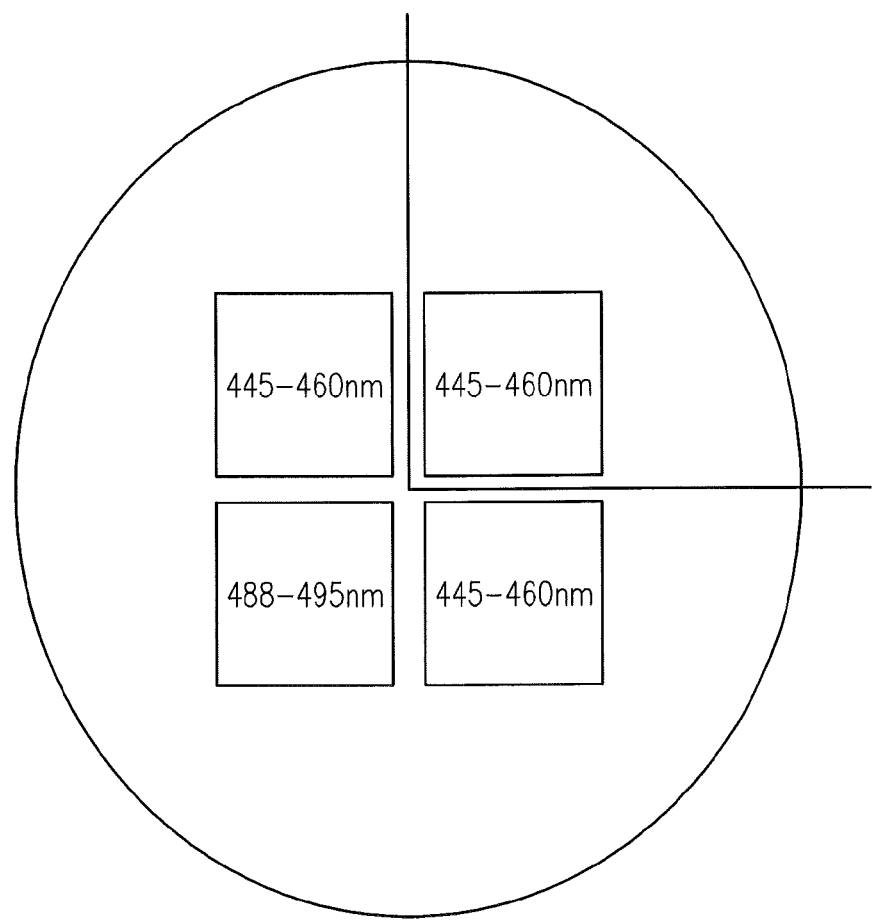
FIG. 9 is an illustration of the layout of a four LED light source using three blue (445-460 nm) LEDs and one cyan (488-495 nm) LED.
Figure 10:
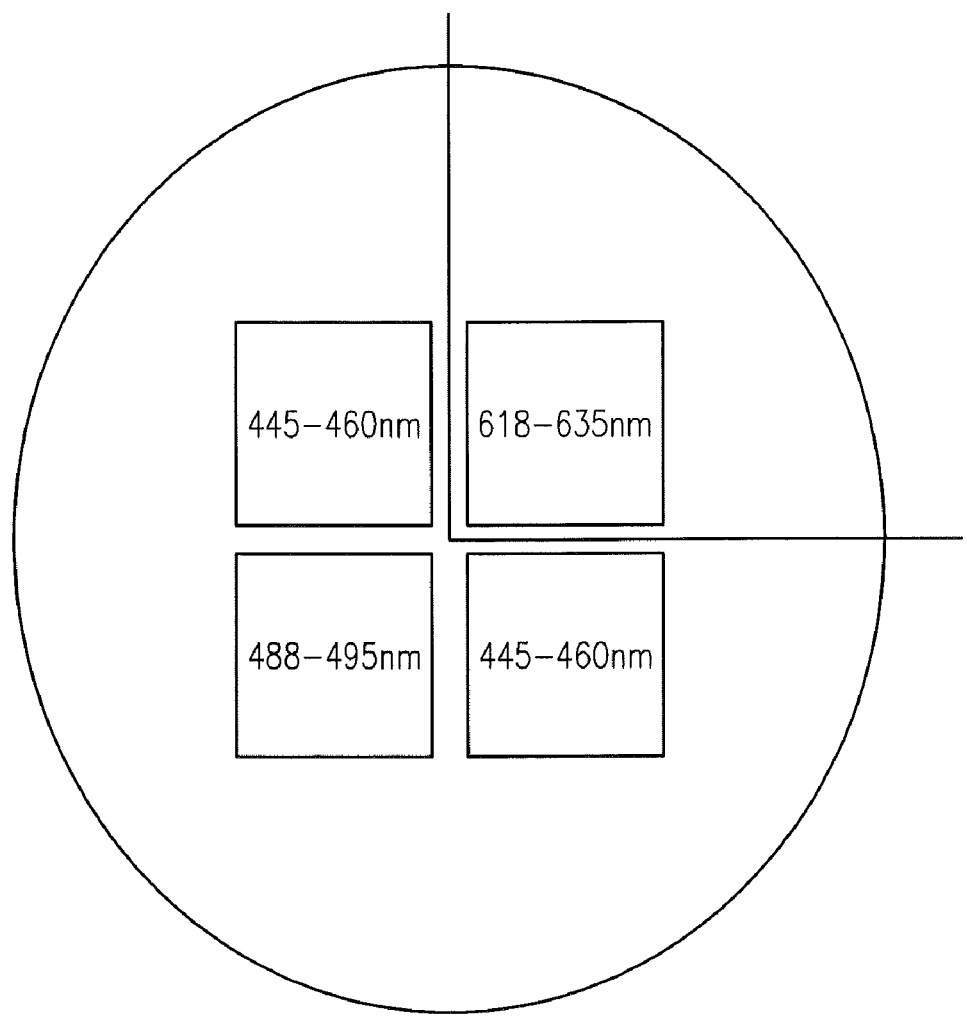
FIG. 10 is an illustration of the layout of a four LED light source using two blue (445-460 nm) LEDs, one cyan (488-495 nm) LED and one red (618-635 nm) LED.

FIGS. 8-10 are illustrations of the layout of various four-LED light source configurations according to the present invention using a plurality of phosphors in the mixed phosphor layer. The particular layout shown in FIG. 8 utilizes four blue (445-460 nm) LEDs; the layout of FIG. 9 utilizes three blue (445-460 nm) LEDs and one cyan (488-495 nm) LED; the layout of FIG. 10 utilizes two blue (445-460 nm) LEDs, one cyan (488-495 nm) LED, and one red (618-635 nm) LED. The LEDs may be mounted on a single circuit board. For example, the LEDs may be mounted on a ceramic substrate in order to provide better thermal handling properties.

Figure 11:
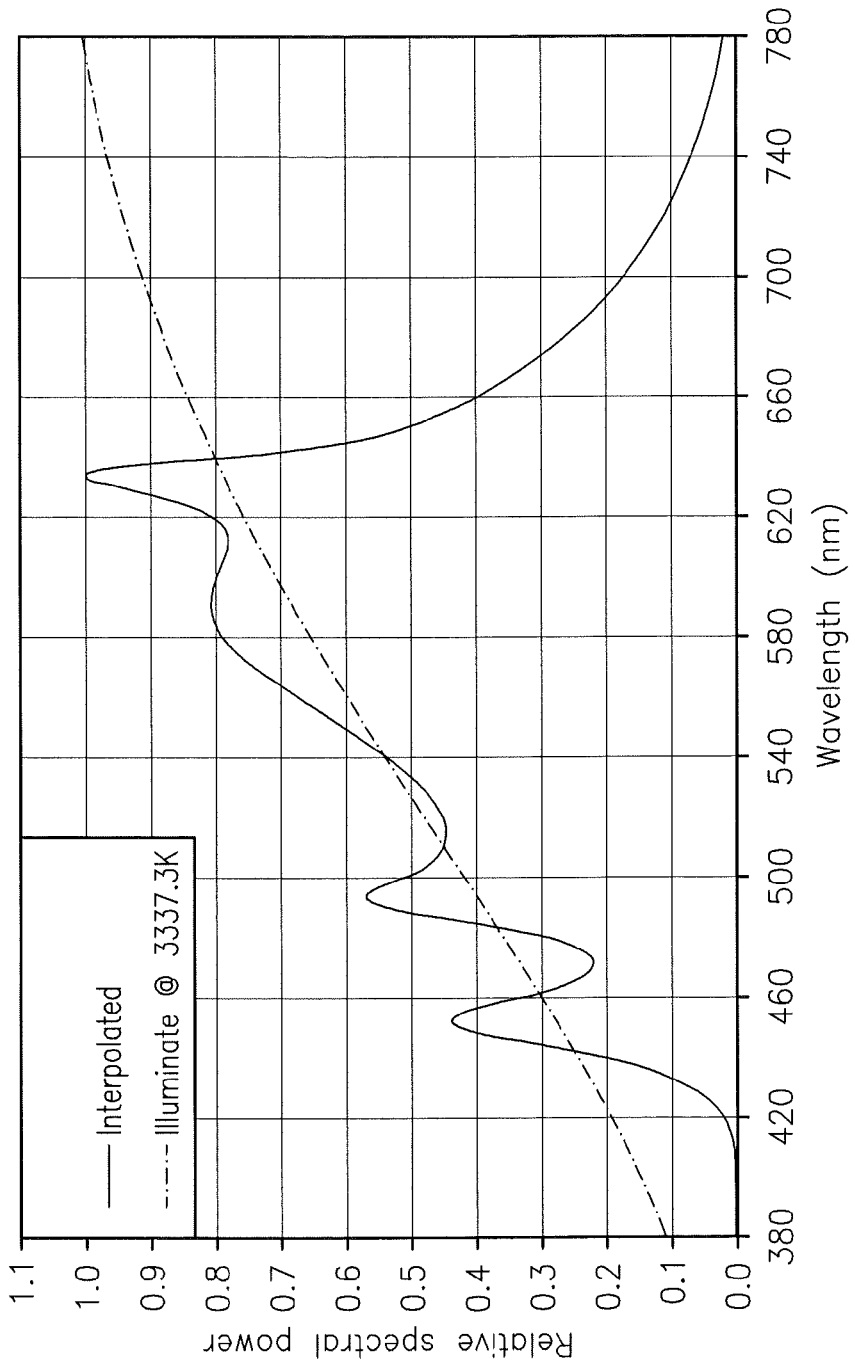
FIG. 11 is an illustration of Relative Spectral Power as a function of wavelength for a four LED light source using two blue (445-460 nm) LEDs (one blue LED with a peak wavelength of 452 nm and one blue LED with a peak wavelength of 458 nm), one cyan (488-495 nm) LED, one red (618-635 nm) LED, with a residual transparency flux ratio for the four LED emitters of 0.6/0.5/5.2/4.1 (blue 452, blue 458, cyan, red), and a 18/45/37 mix of 524/573/600 nm phosphor, producing a luminous flux ratio of 16/40/33.5.

FIG. 11 is an illustration of Relative Spectral Power as a function of wavelength for a four LED light source using two blue (445-460 nm) LEDs (one blue LED with a peak wavelength of 452 nm and one blue LED with a peak wavelength of 458 nm), one cyan (488-495 nm) LED, one red (618-635 nm) LED, and a 18/45/37 mix of 524/573/600 nm phosphor. The dashed line in FIG. 11 represents the theoretical spectral power as a function of wavelength for a light source having a CRI of 100.

For the device illustrated in FIG. 11, the CRI value is approximately 88, and the color temperature is a "warm" color temperature of 3337K. Residual transparency flux ratio refers to the ratio of light output by a particular source which passes through a phosphor unabsorbed (i.e., no conversion of wavelength) versus the total amount of light hitting a detector, such as the human eye. For the device of FIG. 11, the residual transparency flux ratio is 0.6/0.5/5.2/4.1 (blue 452, blue 458, cyan, red). This means that 0.6% of the light hitting a detector, such as the eye, is light emitted by the blue 452 nm LED which passes through the phosphor unabsorbed. Similarly, 0.5% of the light hitting the detector is light emitted by the blue 458 nm LED which passes through the phosphor unabsorbed. Further, 5.2% of the light hitting the detector is light emitted by the cyan LED which passes through the phosphor unabsorbed. Finally, 4.1% of the light hitting the detector is light from the red LED which passes through the phosphor unabsorbed.

Luminous flux ratio (also termed luminescence) refers to the ratio of light emitted by a particular phosphor versus the total amount of light hitting a detector, such as the human eye. For the device of FIG. 11, the luminous flux ratio is 16/40/33.5. This means that 16% of the light hitting the detector is light emitted by the 524 nm phosphor; 40% of the light hitting the detector is light emitted by the 573 nm phosphor; and 33.5% of the light hitting the detector is light emitted by the 600 nm phosphor.

Figure 12B:
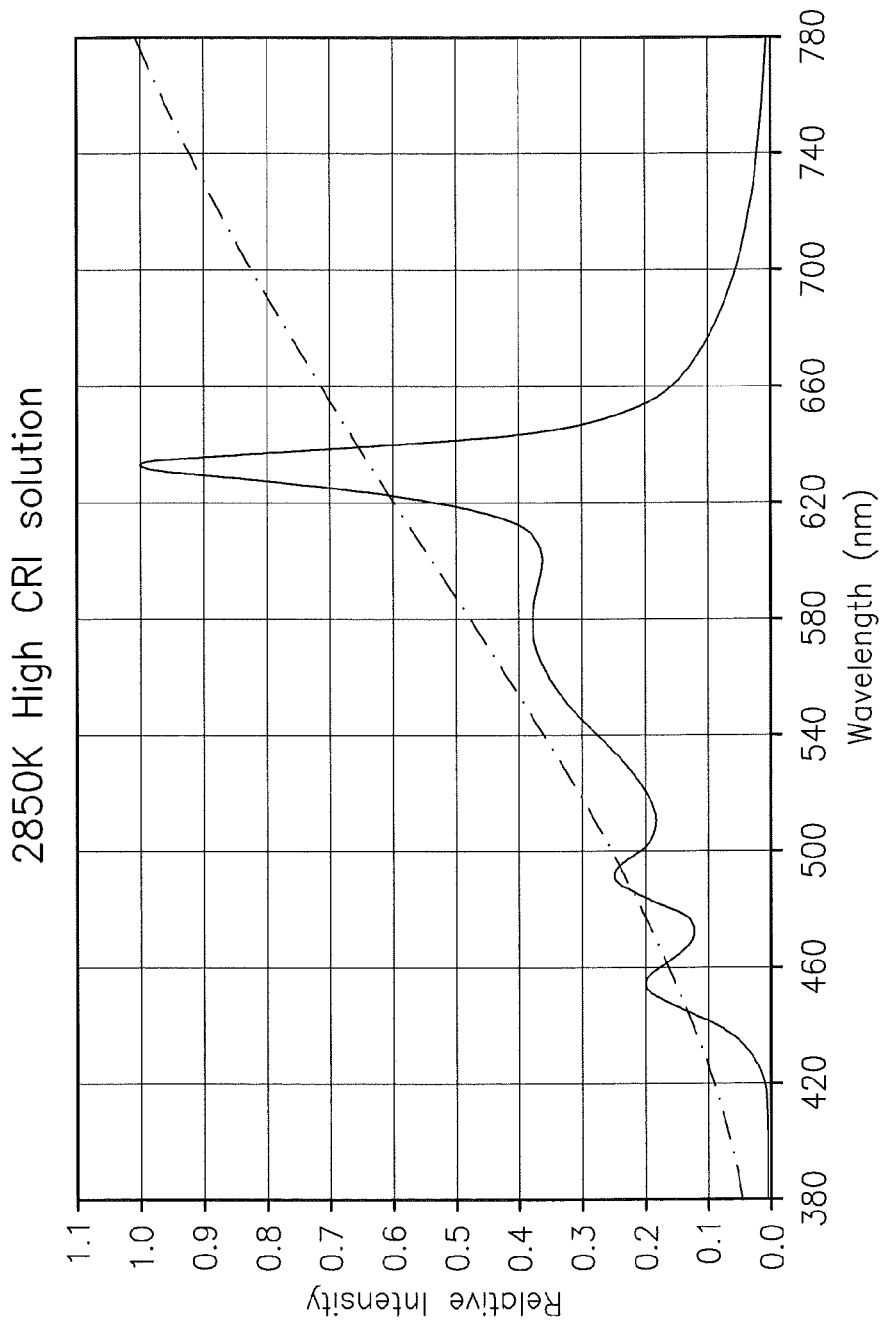
FIG. 12 is an illustration of the Relative Spectral Power as a function of wavelength, as well as the CIE chromaticity chart for a four LED light source using two blue (445-460 nm) LEDs (one blue LED with a peak wavelength of 452 nm and one blue LED with a peak wavelength of 458 nm), one cyan (488-495 nm) LED, one red (618-635 nm) LED, with a residual transparency flux ratio of 0.5/0.7/4.8/12.2 (blue 452, blue 458, cyan, red), and a 19/48/33 mix of 524/573/600 nm phosphor, producing a luminous flux ratio of 15.7/39.5/26.7.
Figure 12C:
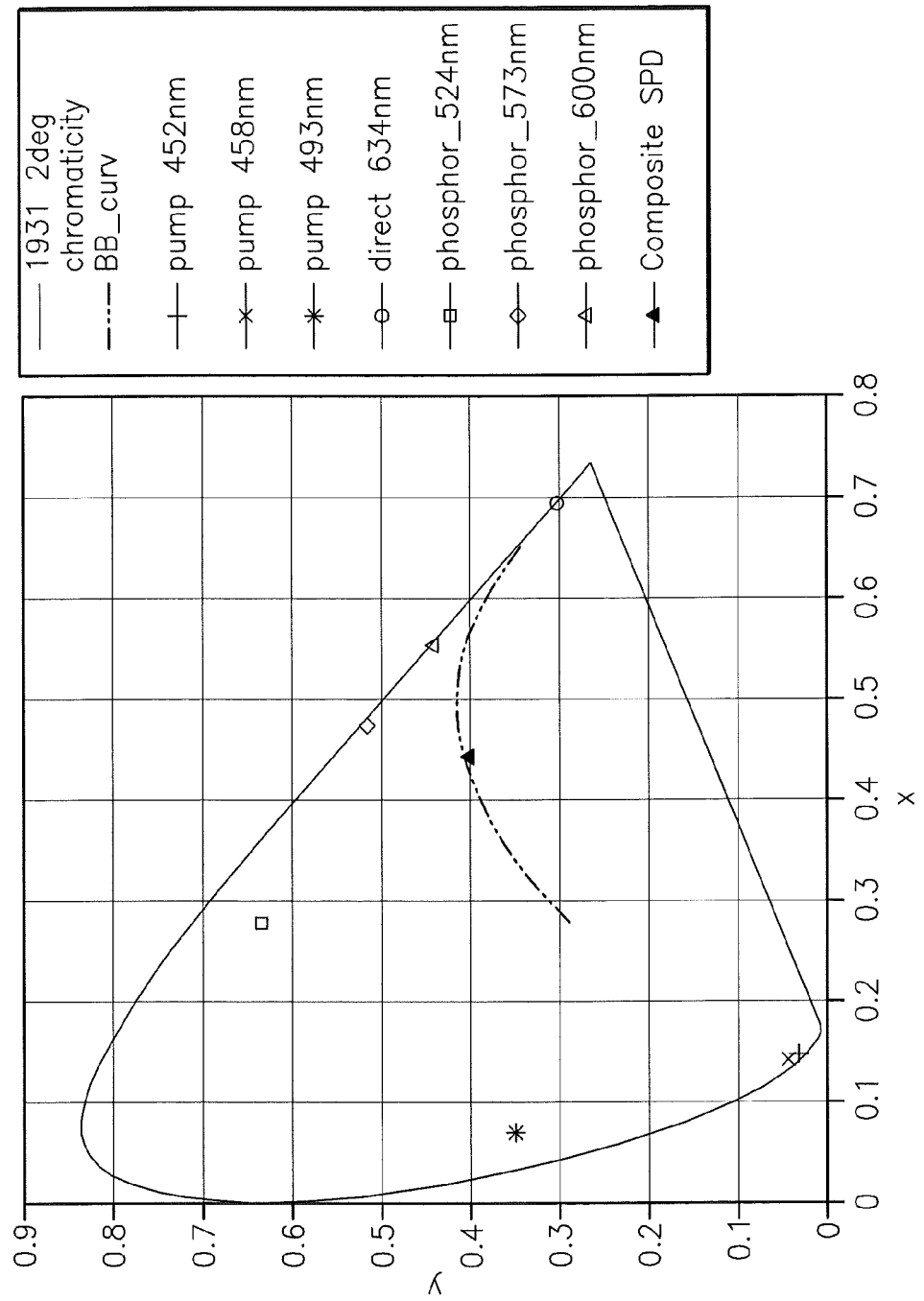

FIG. 12 includes an illustration of Relative Spectral Power as a function of wavelength for a four LED light source using two blue (445-460 nm) LEDs (one blue LED with a peak wavelength of 452 nm and one blue LED with a peak wavelength of 458 nm), one cyan (488-495 nm) LED, one red (618-635 nm) LED, and a 19/48/33 mix of 524/573/600 nm phosphor. The red emitter is "direct", i.e., the light emitted by the red LED does not have a significant change of wavelength as it passes through the mixed phosphor layer. The dashed line in the wavelength chart of FIG. 12 represents the theoretical spectral power as a function of wavelength for a light source having a CRI of 100. For the device illustrated in FIG. 12, the CRI value is 97.4 using an R8 approach (eight color palettes), and 96.8 using an R14 approach (14 color palettes). The color temperature is approximately 2850-2851. FIG. 12 also includes an illustration of the CIE chromaticity chart for the individual LED sources, the phosphor, and the composite spectral power distribution of the light output from the phosphor. For the device of FIG. 12, the residual transparency flux ratio is 0.5/0.7/4.8/12.2. For the device of FIG. 12, the luminous flux ratio contribution provided by the phosphors is 15.7/39.5/26.7.

Figure 13B:
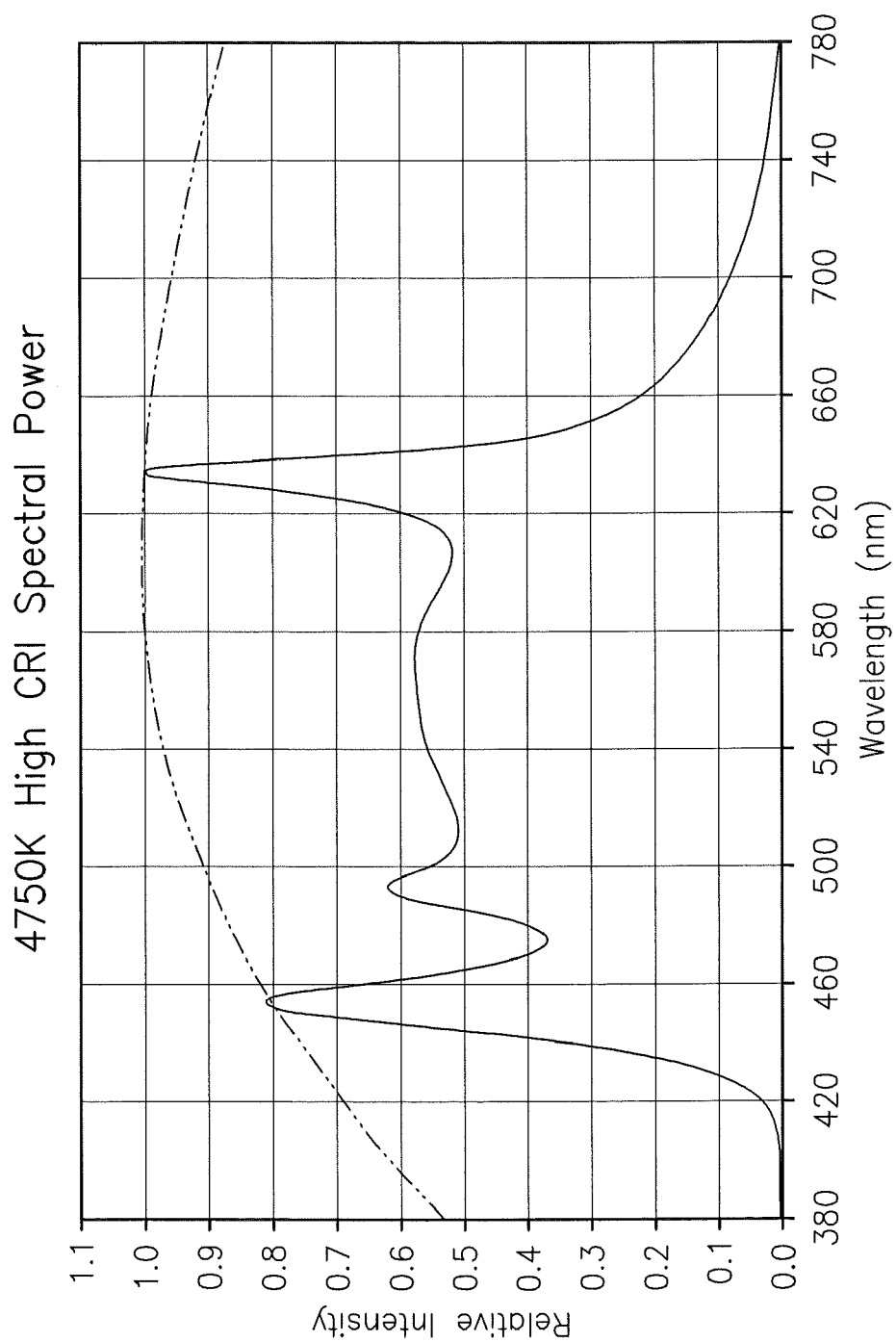
FIG. 13 is an illustration of the Relative Spectral Power as a function of wavelength, as well as the CIE chromaticity chart for a four LED light source using two blue (445-460 nm) LEDs (one blue LED with a peak wavelength of 452 nm and one blue LED with a peak wavelength of 458 nm), one cyan (488-495 nm) LED, one red (618-635 nm) LED, with a residual transparency flux ratio of 1.5/1.3/6.2/6.1 (blue 452, blue 458, cyan, red), and a 41/26/33 mix of 524/573/600 nm phosphor, producing a luminous flux ratio of 34.9/22.1/27.9.
Figure 13C:
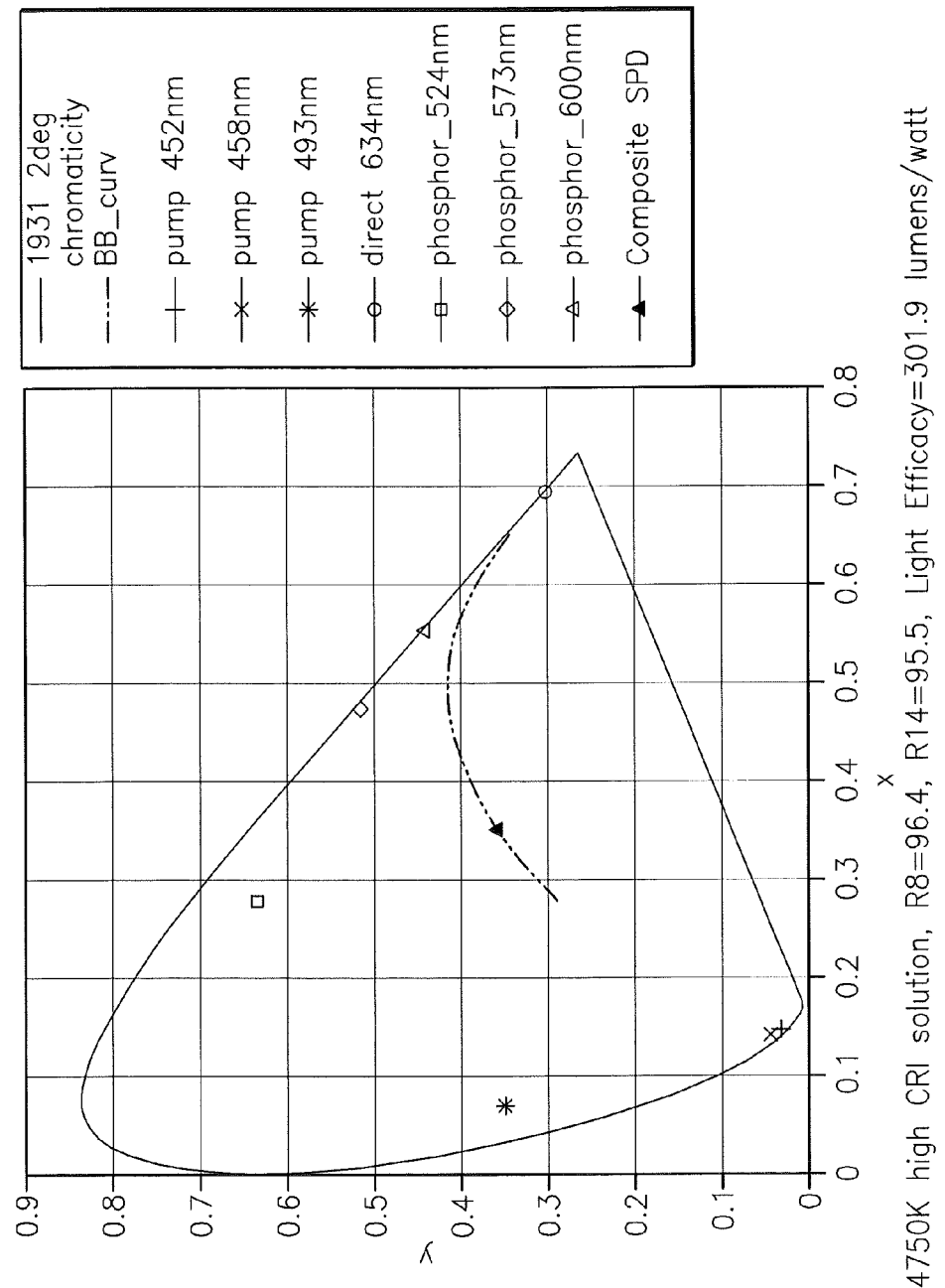

FIG. 13 includes an illustration of Relative Spectral Power as a function of wavelength for a four LED light source using two blue (445-460 nm) LEDs (one blue LED with a peak wavelength of 452 nm and one blue LED with a peak wavelength of 458 nm), one cyan (488-495 nm) LED, one red (618-635 nm) LED, and a 41/26/33 mix of 524/573/600 nm phosphor. The dashed line in the wavelength chart of FIG. 13 represents the theoretical spectral power as a function of wavelength for a light source having a CRI of 100. For the device illustrated in FIG. 13, the CRI value is 96.4 using an R8 approach (eight color palettes), and 95.5 using an R14 approach (14 color palettes). The color temperature is approximately 4750-4753. FIG. 13 also includes an illustration of the CIE chromaticity chart for the individual LED sources, the phosphor, and the composite spectral power distribution of the light output from the phosphor. For the device of FIG. 13, the residual transparency flux ratio is 1.5/1.3/6.2/6.1. For the device of FIG. 13, the luminous flux ratio is 34.9/22.1/27.9.

Figure 14B:
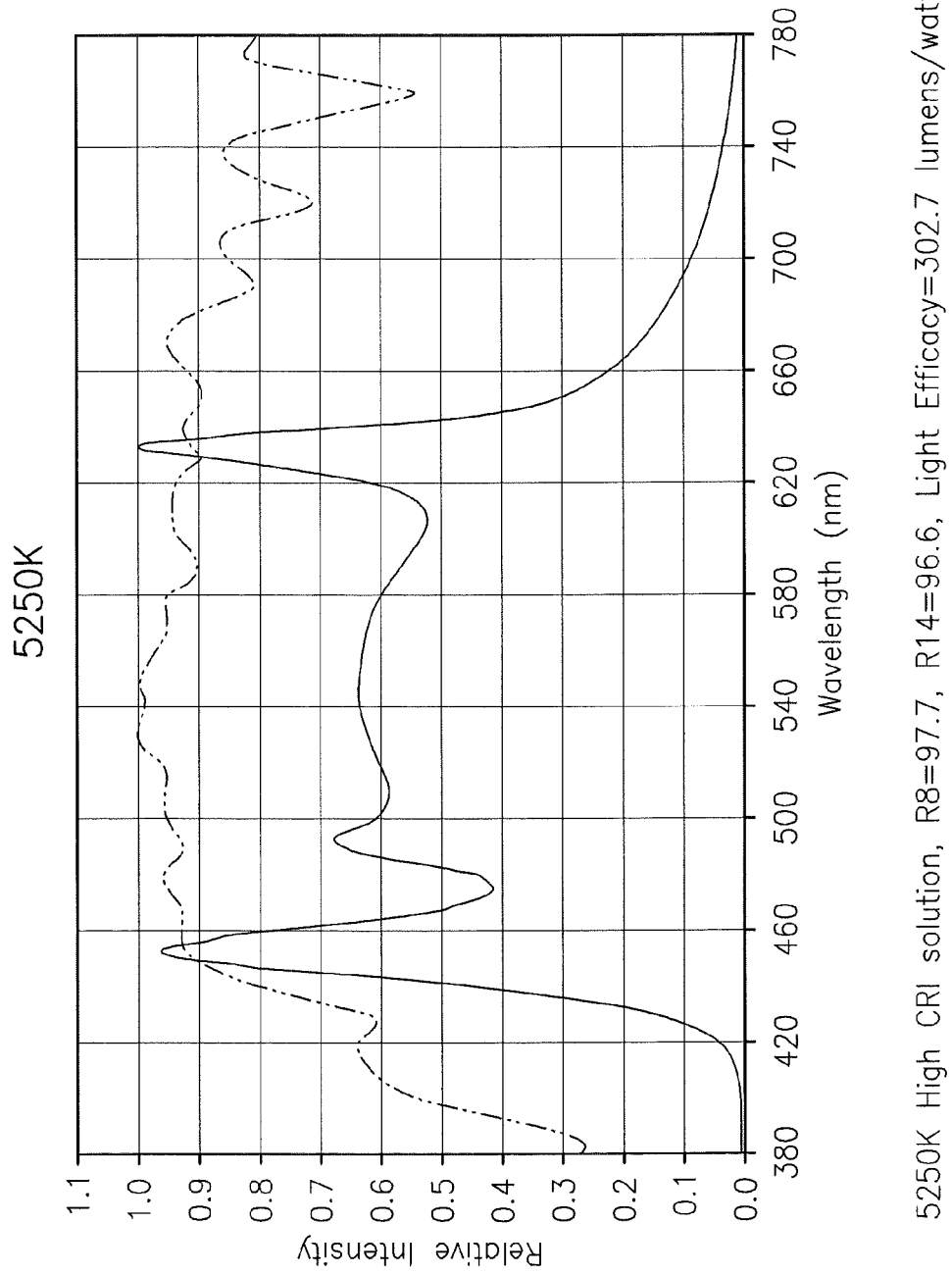
FIG. 14 is an illustration of the Relative Spectral Power as a function of wavelength, as well as the CIE chromaticity chart for a four LED light source using two blue (445-460 nm) LEDs (one blue LED with a peak wavelength of 452 nm and one blue LED with a peak wavelength of 458 nm), one cyan (488-495 nm) LED, one red (618-635 nm) LED, with a residual transparency flux ratio of 1.8/1.2/6.0/5.8 (blue 452, blue 458, cyan, red) and a 46/26/28 mix of 524/573/600 nm phosphor, producing a luminous flux ratio of 39.4/22.1/23.7.
Figure 14C:
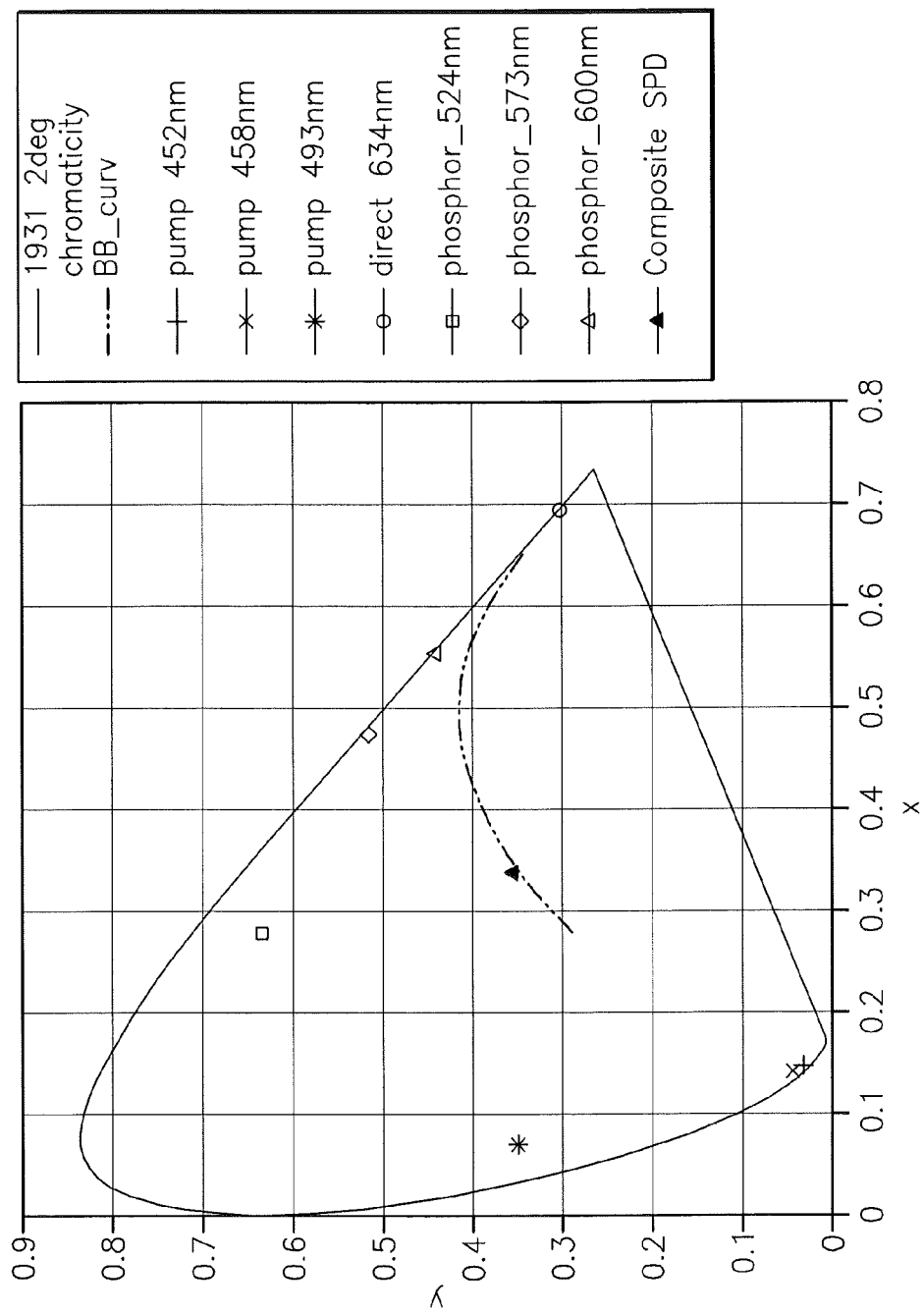

FIG. 14 includes an illustration of Relative Spectral Power as a function of wavelength for a four LED light source using two blue (445-460 nm) LEDs (one blue LED with a peak wavelength of 452 nm and one blue LED with a peak wavelength of 458 nm), one cyan (488-495 nm) LED, one red (618-635 nm) LED, and a 46/26/28 mix of 524/573/600 nm phosphor. The dashed line in the wavelength chart of FIG. 14 represents the theoretical spectral power as a function of wavelength for a light source having a CRI of 100. For the device illustrated in FIG. 14, the CRI value is 97.5 using an R8 approach (eight color palettes), and 96.6 using an R14 approach (14 color palettes). The color temperature is approximately 5248-5250. FIG. 14 also includes an illustration of the CIE chromaticity chart for the individual LED sources, the phosphor, and the composite spectral power distribution of the light output from the phosphor. For the device of FIG. 14, the residual transparency flux ratio is 1.8/1.2/6.0/5.8. For the device of FIG. 14, the luminous flux ratio is 39.4/22.1/23.7.

Figure 15B:
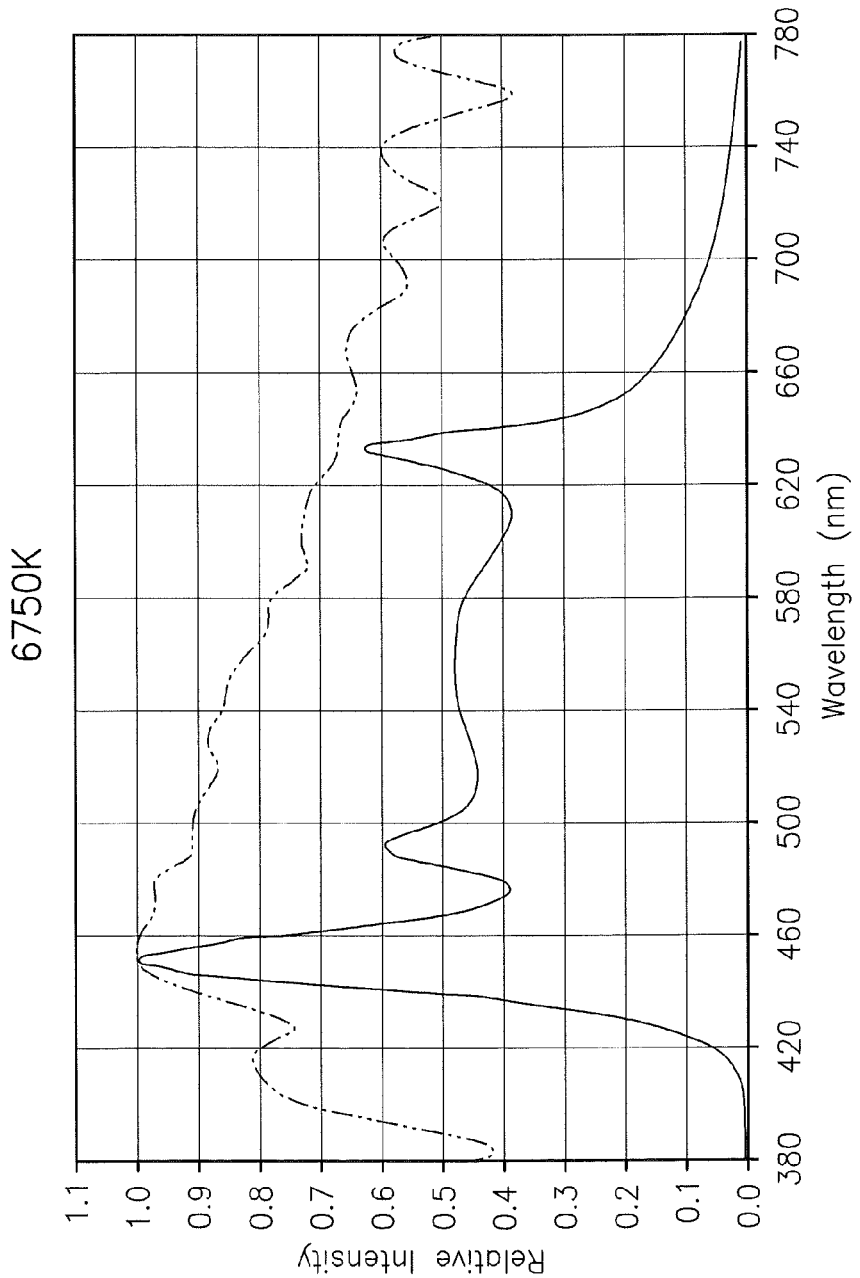
FIG. 15 is an illustration of the Relative Spectral Power as a function of wavelength, as well as the CIE chromaticity chart for a four LED light source using two blue (445-460 nm) LEDs (one blue LED with a peak wavelength of 450 nm and one blue LED with a peak wavelength of 458 nm), one cyan (488-495 nm) LED, one red (618-635 nm) LED, with a residual transparency flux ratio of 2.3/1.6/7.7/4.2 (blue 450, blue 458, cyan, red) and a 43/31/26 mix of 524/573/600 nm phosphor, producing a luminous flux ratio of 36.5/26.0/21.6.
Figure 15C:
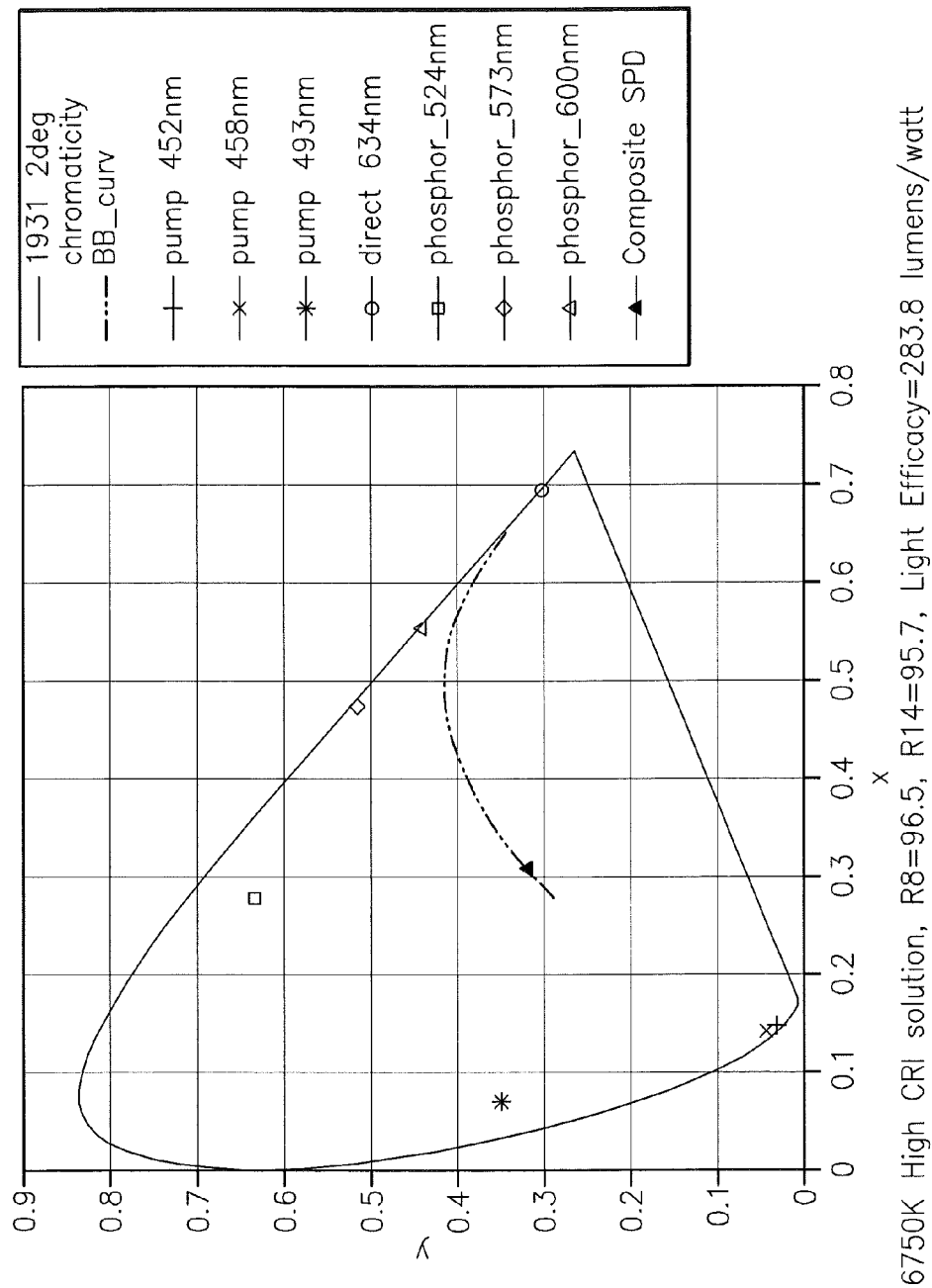

FIG. 15 includes an illustration of Relative Spectral Power as a function of wavelength for a four LED light source using two blue (445-460 nm) LEDs (one blue LED with a peak wavelength of 452 nm and one blue LED with a peak wavelength of 458 nm), one cyan (488-495 nm) LED, one red (618-635 nm) LED, and a 43/31/26 mix of 524/573/600 nm phosphor. The dashed line in the wavelength chart of FIG. 15 represents the theoretical spectral power as a function of wavelength for a light source having a CRI of 100. For the device illustrated in FIG. 15, the CRI value is 96.5 using an R8 approach (eight color palettes), and 95.7 using an R14 approach (14 color palettes). The color temperature is approximately 6750-6757. FIG. 15 also includes an illustration of the CIE chromaticity chart for the individual LED sources, the phosphor, and the composite spectral power distribution of the light output from the phosphor. For the device of FIG. 15, the residual transparency flux ratio is 2.3/1.6/7.7/4.2. For the device of FIG. 15, the luminous flux ratio is 36.5/26.0/21.6.

Figure 16:
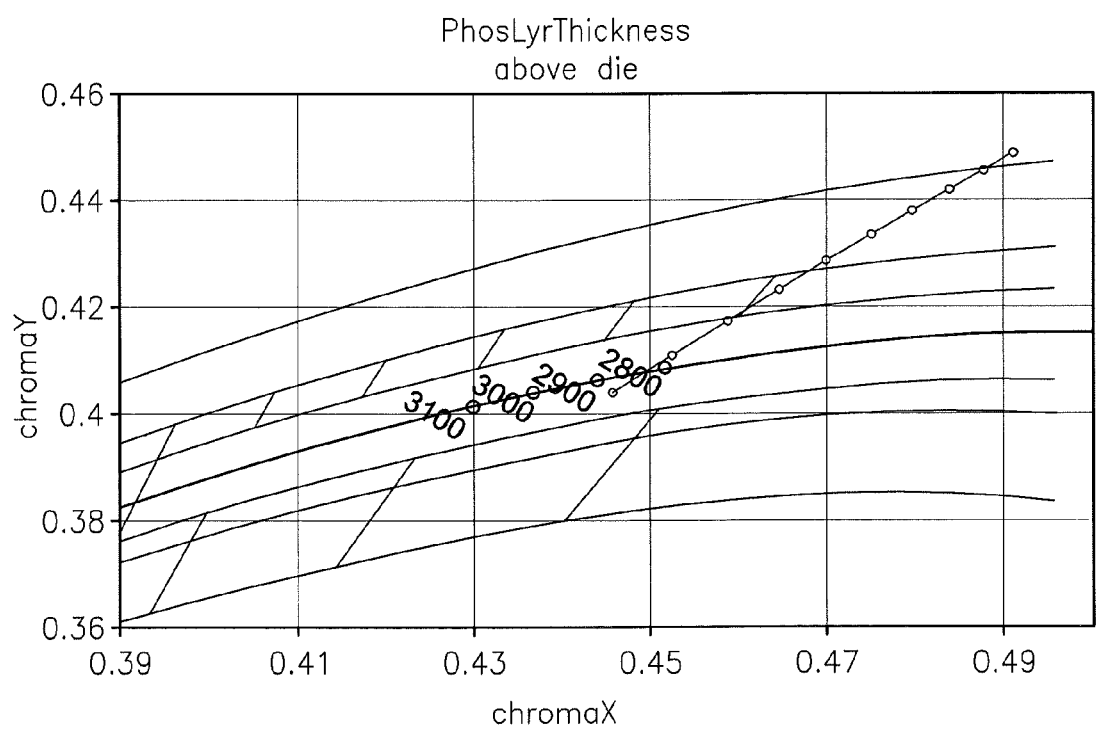
FIG. 16 is an illustration of the effect of phosphor thickness upon the chromaX and chromaY of the light, using three blue die emitters (wavelength 452 nm dominant) plus one red emitter (623 nm dominant) plus one phosphor (573 nm peak wavelength).

FIG. 16 includes an illustration of the effect of phosphor thickness upon the chromaticity of an LED lighting system having three blue die emitters (wavelength 452 nm dominant) plus one red emitter (623 nm dominant) plus one phosphor (573 nm peak wavelength).

As presented above, by varying the properties of the LEDs used in the light source, and also by varying the properties of the phosphor layer, the CRI, as well as the color temperature, of the resulting device may be modified to achieve desired CRI and color temperature ranges for any particular lighting application. It will also be understood that the peak wavelength of phosphors within the mixed phosphor layer may vary by ±5 nm or more, in order to produce light having a more desirable combination of high CRI and high LER.

While there have been shown, described, and pointed out fundamental novel features of the invention as applied to a preferred embodiment thereof, it will be understood that various omissions, substitutions, and changes in the form and details of the devices illustrated, and in their operation, may be made by those skilled in the art without departing from the spirit and scope of the invention. For example, it is expressly intended that all combinations of those elements and/or steps which perform substantially the same function, in substantially the same way, to achieve the same results are within the scope of the invention. Substitutions of elements from one described embodiment to another are also fully intended and contemplated. It is also to be understood that the drawings are not necessarily drawn to scale, but that they are merely conceptual in nature. It is the intention, therefore, to be limited only as indicated by the scope of the claims appended hereto.

The invention claimed is:

1. An LED lighting system for producing light having improved CRI, comprising:
 a plurality of LEDs, each LED disposed and configured to produce respective LED-emitted light, wherein the plurality of LEDs include three blue LEDs having a first characteristic wavelength and a cyan LED having a second characteristic wavelength, wherein the first characteristic wavelength is different from the second characteristic wavelength; and
 a mixed phosphor layer overlying at least a portion of one of the plurality of LEDs, the mixed phosphor layer having a first phosphor and a second phosphor disposed and configured to absorb at least a portion of the respective LED-emitted light and produce phosphor-emitted light~ the first phosphor forming 85%-95% of the mixed phosphor layer and producing, a phosphor-emitted light of a third characteristic wavelength, the second phosphor forming 5%-15% of the mixed phosphor layer and producing a phosphor emitted light of a fourth characteristic wavelength, wherein the third characteristic wavelength is different than the fourth characteristic wavelength.

2. The LED lighting system of claim 1, wherein the phosphor-emitted light and unabsorbed LED-emitted light are combinable to produce a light having a CRI in the range of 77 to 100.

3. The LED lighting system of claim 1, wherein the mixed phosphor layer overlies all of the LEDs.

4. The LED lighting system of claim 1, wherein the mixed phosphor layer overlies a part of all of the LEDs.

5. The LED lighting system of claim 1, wherein the mixed phosphor layer overlies all of at least one LED.

6. The LED lighting system of claim 1, wherein the mixed phosphor layer is deposited directly on a surface of an LED die of each LED.

7. The LED lighting system of claim 1, wherein the mixed phosphor layer is a separate structure above the plurality of LEDs.

8. The LED lighting system of claim 1, wherein:
 the first phosphor comprises a 600 nm phosphor having a characteristic wavelength of 600 nm; and
 the second phosphor comprises a 573 nm phosphor having a characteristic wavelength of 573 nm, wherein the 600 nm phosphor forms 85%-95% of the mixed phosphor layer, and the 573 nm phosphor forms 5%-15% of the mixed phosphor layer.

9. The LED lighting system of claim 1, wherein:
 the first phosphor comprises a 600 nm phosphor having a characteristic wavelength of 600 nm; and
 the second phosphor comprises a 524 nm phosphor having a characteristic wavelength of 524 nm, wherein the 600 nm phosphor forms 85%-95% of the mixed phosphor layer, and the 524 nm phosphor forms 5%-15% of the mixed phosphor layer.

10. An LED lighting system for producing light having improved CRI, comprising:
 a plurality of LEDs, each LED disposed and configured to produce respective LED-emitted light, wherein the plurality of LEDs include at least one LED having a first characteristic wavelength;
 a mixed phosphor layer overlying at least a portion of one of the plurality of LEDs, the mixed phosphor layer having a first phosphor, a second phosphor, and a third phosphor disposed and configured to absorb at least a portion of the respective LED-emitted light and to produce phosphor-emitted light, the first phosphor producing at least a phosphor-emitted light of a second characteristic wavelength, the second phosphor producing a phosphor-emitted light of a third characteristic wavelength and the third phosphor producing a phosphor emitted light of a fourth characteristic wavelength, wherein the second characteristic wavelength is different than the third characteristic wavelength, the third characteristic wavelength is different than the fourth characteristic wavelength, and the fourth characteristic wavelength is different than the second characteristic wavelength;
 wherein the plurality of LEDs further comprises:
  one red LED;
  one blue LED configured to emit 452 nm light;
  one blue LED configured to emit 458 nm light; and
  one cyan LED; and
  the first phosphor comprises a 600 nm phosphor configured to emit 600 nm light;
  the second phosphor comprises a 573 nm phosphor configured to emit 573 nm light; and
  the third phosphor comprises a 524 nm phosphor configured to emit 524 nm light.

11. The LED lighting system of claim 10, wherein the phosphor-emitted light and unabsorbed LED-emitted light are combinable to produce a light having a CRI in the range of 77 to 100.

12. The LED lighting system of claim 10, wherein the mixed phosphor layer overlies all of the LEDs.

13. The LED lighting system of claim 10, wherein the mixed phosphor layer overlies a part of all of the LEDs.

14. The LED lighting system of claim 10, wherein the mixed phosphor layer overlies all of at least one LED.

15. The LED lighting system of claim 10, wherein the mixed phosphor layer is deposited directly on a surface of an LED die of each LED.

16. The LED lighting system of claim 10, wherein the mixed phosphor layer is a separate structure above the plurality of LEDs.

17. The LED lighting system of claim 10, wherein the phosphor-emitted light comprises: 16%-20% of 524 nm light; 43%-47% of 573 nm light; and 35%-39% of 600 nm light.

18. The LED lighting system of claim 10, wherein the phosphor-emitted light comprises: 17%-21% of 524 nm light; 46%-50% of 573 nm light; and 31%-35% of 600 nm light.

19. The LED lighting system of claim 10, wherein the phosphor-emitted light comprises: 39%-43% of 524 nm light; 24%-28% of 573 nm light; and 31%-35% of 600 nm light.

20. The LED lighting system of claim 10, wherein the phosphor-emitted light comprises: 44%-48% of 524 nm light; 24%-28% of 573 nm light; and 26%-30% of 600 nm light.

21. The LED lighting system of claim 10, wherein the phosphor-emitted light comprises: 41%-45% of 524 nm light; 29%-33% of 573 nm light; and 24%-28% of 600 nm light.

22. A method of producing light having improved CRI, comprising the steps:

providing a plurality of LEDs, each LED producing respective LED-emitted light, wherein the plurality of LEDs include three blue LEDs having a first characteristic wavelength and a cyan LED having a second characteristic wavelength, wherein the first characteristic wavelength is different from the second characteristic wavelength;

absorbing at least a portion of the respective LED-emitted light using a mixed phosphor layer having a first phosphor and a second phosphor, the first phosphor forming 85%-95% of the mixed phosphor layer, the second phosphor forming 5%-15% of the mixed phosphor layer, wherein the mixed phosphor layer overlies at least a portion of one of the plurality of LEDs, the mixed phosphor layer absorbing at least a portion of the respective LED-emitted light; and emitting a phosphor-emitted light, including at least a phosphor-emitted light of a third characteristic wavelength from the first phosphor, and a phosphor emitted light of a fourth characteristic wavelength from the second phosphor;

wherein a combination of phosphor-emitted light and LED-emitted light not absorbed by the mixed phosphor layer is light having improved CRI as compared with the LED-emitted light not absorbed by the mixed phosphor layer.

23. The method of claim 22, wherein the phosphor-emitted light and the unabsorbed LED-emitted light combine to produce a light having a CRI in the range of 77 to 100.

24. The method of claim 22, wherein the mixed phosphor layer overlies all of the LEDs.

25. The method of claim 22, wherein the mixed phosphor layer overlies a part of all of the LEDs.

26. The method of claim 22, wherein the mixed phosphor layer overlies all of at least one LED.

27. The method of claim 22, wherein the mixed phosphor layer is deposited directly on a surface of an LED die of each LED.

28. The method of claim 22, wherein the mixed phosphor layer is a separate structure above the plurality of LEDs.

* * * * *